United States Patent
Watanabe et al.

(10) Patent No.: US 7,317,324 B2
(45) Date of Patent: Jan. 8, 2008

(54) SEMICONDUCTOR INTEGRATED CIRCUIT TESTING DEVICE AND METHOD

(75) Inventors: Hiroshi Watanabe, Tokyo (JP); Tatsuji Ikeda, Kanagawa (JP); Kazuya Takahashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 501 days.

(21) Appl. No.: 10/979,245

(22) Filed: Nov. 3, 2004

(65) Prior Publication Data

US 2005/0093561 A1 May 5, 2005

(30) Foreign Application Priority Data

Nov. 4, 2003 (JP) ............................. 2003-374912
Oct. 4, 2004 (JP) ............................. 2004-291813

(51) Int. Cl.
*G01R 31/26* (2006.01)

(52) U.S. Cl. ..................................... 324/765

(58) Field of Classification Search ................ None
See application file for complete search history.

(56) References Cited

U.S. PATENT DOCUMENTS

| | | | | |
|---|---|---|---|---|
| 5,451,798 A | | 9/1995 | Tsuda et al. ................ 257/139 |
| 5,610,435 A | | 3/1997 | Watanabe et al. ........... 257/629 |
| 5,760,599 A | * | 6/1998 | Ehiro .......................... 324/765 |
| 5,904,611 A | | 5/1999 | Takahashi et al. ............ 451/41 |
| 5,959,957 A | | 9/1999 | Ikeda et al. ................. 369/127 |
| 6,149,500 A | | 11/2000 | Takahashi et al. ............ 451/41 |
| 6,157,200 A | * | 12/2000 | Okayasu ..................... 324/753 |
| 6,215,695 B1 | | 4/2001 | Ikeda .......................... 365/158 |
| 6,332,835 B1 | | 12/2001 | Nishimura et al. ........... 451/67 |
| 6,492,831 B2 | * | 12/2002 | Hashimoto .................. 324/765 |
| 6,615,152 B2 | * | 9/2003 | Fujimoto et al. ............. 702/94 |
| 6,643,830 B1 | | 11/2003 | Watanabe ...................... 716/4 |
| 6,727,723 B2 | * | 4/2004 | Shimizu et al. ............. 324/765 |
| 6,750,672 B2 | * | 6/2004 | Tanimura et al. ........... 324/765 |
| 6,776,691 B2 | | 8/2004 | Nishimura et al. ........... 451/36 |
| 7,225,377 B2 | * | 5/2007 | Ishida et al. ................ 714/738 |
| 2003/0016045 A1 | * | 1/2003 | Tanimura et al. ........... 324/765 |

\* cited by examiner

*Primary Examiner*—Jermele Hollington
(74) *Attorney, Agent, or Firm*—Fitzpatrick, Cella, Harper & Scinto

(57) ABSTRACT

A plurality of resistors is connected to a plurality of output terminals of a semiconductor integrated circuit, respectively, and a predetermined voltage is applied to the plurality of resistors. Also, a predetermined operation pattern signal used to test functions of the semiconductor integrated circuit is input to a plurality of input terminals of the semiconductor integrated circuit. Thus, a total sum of amounts of currents caused to flow through the plurality of resistors, respectively, is measured. The total sum of amounts of currents thus measured is compared with a normal value of a total sum of amounts of currents which are measured in a non-defective sample which is used instead of the semiconductor integrated circuit and is verified in advance to normally operate. It is judged based on the comparison results whether or not the semiconductor integrated circuit is normal. As a result, whether or not the semiconductor integrated circuit is a non-defective or a defective can be simply judged without performing logic simulation and failure simulation.

17 Claims, 23 Drawing Sheets

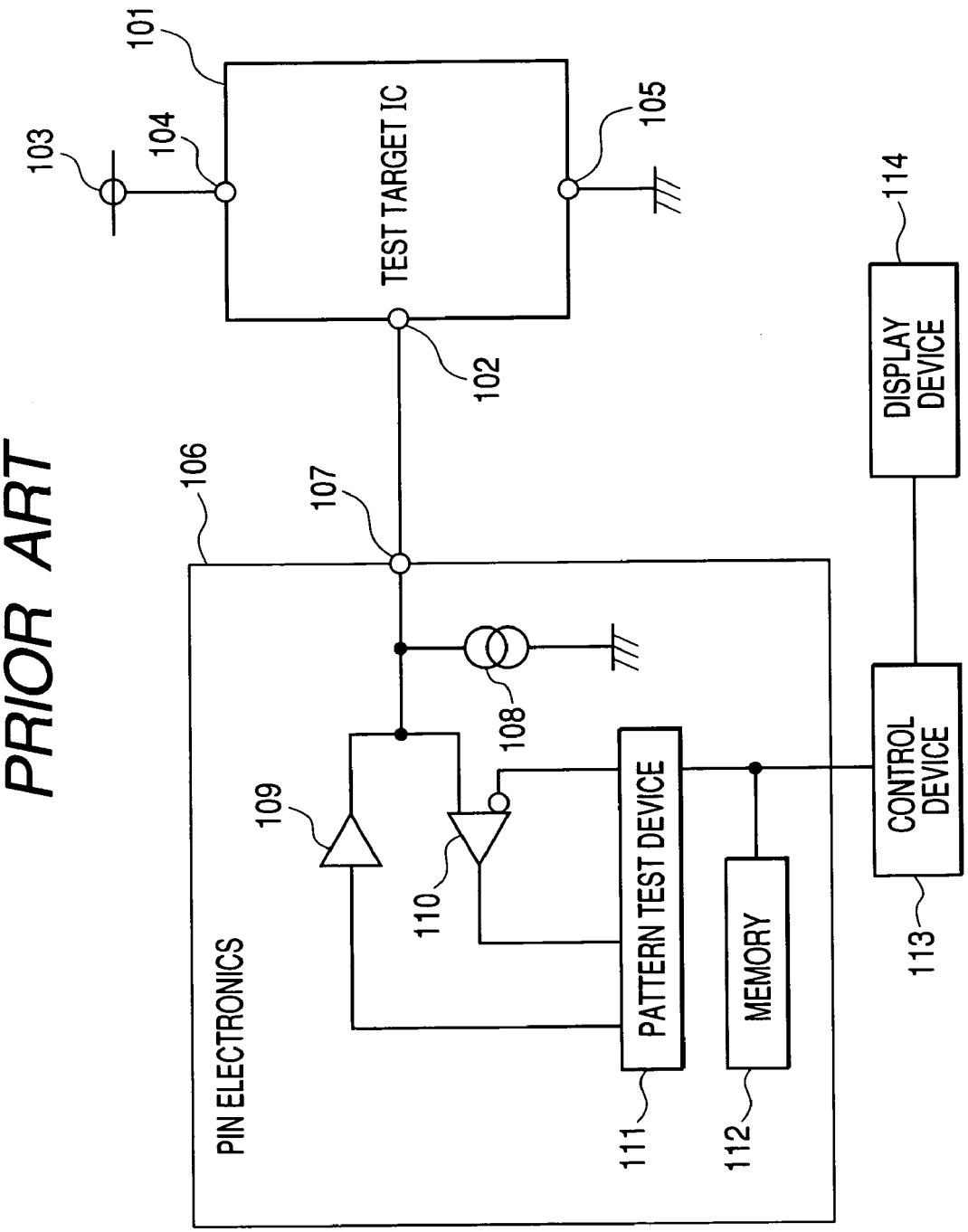

SEMICONDUCTOR INTEGRATED CIRCUIT TESTING DEVICE AND METHOD

BACKGROUND OF THE INVENTION

1. Field of the Invention

The present invention relates to a semiconductor integrated circuit testing device and method for testing functions of a semiconductor integrated circuit.

2. Related Background Art

Heretofore, in testing functions of a semiconductor integrated circuit including a logic circuit, a method has been adopted in which a pattern signal of a predetermined test pattern for testing the functions of the semiconductor integrated circuit is input to the semiconductor integrated circuit, and a signal value of an output pattern from the semiconductor integrated circuit is compared with an output pattern expected value, thereby judging whether the semiconductor integrated circuit is a defective or a non-defective (refer to "VLSI Test/Failure Analysis Technology," Triceps Co., Ltd., pp. 119 and 120 (1992). The predetermined test pattern is a test pattern set such that an expected value of an output pattern which is to be output from the semiconductor integrated circuit when the pattern signal of the test pattern is input to the semiconductor integrated circuit becomes clear in advance through logic simulation and the like.

FIG. 23 is a block diagram, partly in circuit diagram, showing an example of a configuration of a conventional testing device for testing a semiconductor integrated circuit.

A signal terminal 102 of a test target IC 101 is connected to an input-output terminal 107 of a pin electronics 106.

The input-output terminal 107 is connected to a driver 109, a comparator 110, and a load 108. The driver 109 and the comparator 110 are connected to a pattern test device 111.

The pattern test device 111 reads out/writes a pattern signal used to test functions of the test target IC 101 from/to a memory 112, and when the signal terminal 102 is in an input state, sends the pattern signal read out from the memory 112 to the driver 109. Then, the driver 109 sends the pattern signal sent thereto to the test target IC 101. On the other hand, when the signal terminal 102 is in an output state, the comparator 110 receives a signal of an output pattern which has been output from the test target IC 101 through the signal terminal 102, and then the pattern test device 111 stores the output pattern in the memory 112.

A load current is caused to flow through the load 108 in correspondence to the output logic (a high level or a low level) at the signal terminal 102. Note that when the signal terminal 102 is in the output state, the driver 109 changes a state of an output over to a high impedance state to prevent an excessive current from flowing thereinto.

The pattern signal of the output pattern of the test target IC 101 stored in the memory 112 is compared with the expected value by a control device 113, and information related to whether or not the output pattern agrees with the expected value is displayed on a display device 114.

While only one signal terminal 102 of the test target IC 101 is illustrated in FIG. 23, in actuality, the plurality of signal terminals 102 exist. Then, the pin electronics 106 is provided in the same number as that of signal terminals in the test target IC 101. In addition, a power supply terminal 104 of the test target IC 101 is connected to a power supply 103 or the like built in the testing device, and a GND terminal 105 is connected to GND of the testing device.

The conventional testing device, for example, is configured as described above, and in general, an ISL (IC) tester or the like is used in such a testing device.

Now, in the conventional testing method based on the test pattern in which the expected value of the output pattern becomes clear, as the scale of a semiconductor integrated circuit to be measured becomes large, it becomes difficult to produce a test pattern in which all logic states are simulated, and hence an area which is undetected with the test pattern exists. As a result, there is a possibility that the nonconformity may occur such that in a machinery or the like having a semiconductor integrated circuit as one of constituent elements, when the machinery is used in the above-mentioned undetected area, the machinery does not normally operate.

When such nonconformity occurs, there is adopted a method in which logic simulation and failure simulation are carried out based on the fault phenomenon of the machinery, a test pattern is provided with which the fault phenomenon can be detected, and the test pattern is added to the original test pattern.

However, it is difficult to verify the logic state of the semiconductor integrated circuit when the semiconductor integrated circuit is used in the machinery in many cases. In addition, in the method based on the simulation, an enormous amount of data must be processed. Thus, a simpler method is required.

In addition, the conventional testing device shown in FIG. 23 has the following problems.

(1) Output states of a plurality of terminals such as output terminals and input-output terminals of the test target IC 101 must be monitored at all times by the comparator 110.

(2) The control device 112 must compare data of an output state, at the signal terminal 102 of the test target IC 101, detected by the comparator 110 with the expected value of the output pattern stored in the memory 112 at high speed.

(3) When the number of terminals of the test target IC 101 is large, and when a parallel test is carried out with which a plurality of test target ICs are tested at a time, the comparators 110 must be prepared in great numbers, and a capacity of the memory 112 must be increased. Thus, the scale of the LSI tester becomes necessarily large. In addition, the test/judgment must be simultaneously carried out for a plurality of terminals, which requires the advanced technique and thus inevitably leads to an increased cost of the testing device.

SUMMARY OF THE INVENTION

In the light of the foregoing, it is an object of the present invention to provide a semiconductor integrated circuit testing device and method which are capable of simply judging whether a semiconductor integrated circuit is a defective or a non-defective without carrying out logic simulation and failure simulation.

It is another object of the present invention to provide a semiconductor integrated circuit testing device and method which realize miniaturization, high-speed processing, and low cost.

According to one aspect, the present invention which achieves these objectives relates to a semiconductor integrated circuit testing device, including: a plurality of resistors connected to a plurality of output terminals of a semiconductor integrated circuit including a logic circuit; application means for applying a predetermined voltage to the plurality of resistors; input means for inputting a predetermined operation pattern signal to a plurality of input terminals of the semiconductor integrated circuit; measure means for measuring a total sum of amounts of currents which are caused to flow through the plurality of resistors, respectively, based on the predetermined operation pattern signal input with the input means; comparison means for comparing a total sum of amounts of currents which are measured in the semiconductor integrated circuit with the measure means with a normal value of a total sum of amounts of currents which are measured with the measure means in a non-defective sample which is used instead of the semiconductor integrated circuit and is verified in advance to normally operate based on the input predetermined operation pattern signal; and judgment means for judging, based on the comparison results obtained with the comparison means, whether or not the semiconductor integrated circuit is normal.

According to another aspect, the present invention which achieves these objectives relates to a semiconductor integrated circuit testing method applied to a semiconductor integrated circuit testing device including a plurality of resistors connected to a plurality of output terminals of a semiconductor integrated circuit, the method including: an application step of applying a predetermined voltage to the plurality of resistors; an input step of inputting a predetermined operation pattern signal to a plurality of input terminals of the semiconductor integrated circuit; a measure step of measuring a total sum of amounts of currents which are caused to flow through the plurality of resistors, respectively, based on the predetermined operation pattern signal input through the input step; a comparison step of comparing a total sum of amounts of currents which are measured in the semiconductor integrated circuit through the measure step with a normal value of a total sum of amounts of currents which are measured through the measure step in a non-defective sample which is used instead of the semiconductor integrated circuit and is verified in advance to normally operate based on the input predetermined operation pattern signal; and a judgment step of judging, based on the comparison results obtained through the comparison step, whether or not the semiconductor integrated circuit is normal.

Other objectives and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

FIG. 23 is a block diagram, partly in circuit diagram, showing an example of a configuration of a conventional semiconductor integrated circuit testing device.

DESCRIPTION OF THE PREFERRED EMBODIMENTS

Preferred embodiments of the present invention will hereinafter be described in detail with reference to the accompanying drawings.

Embodiment 1

Figure 1:
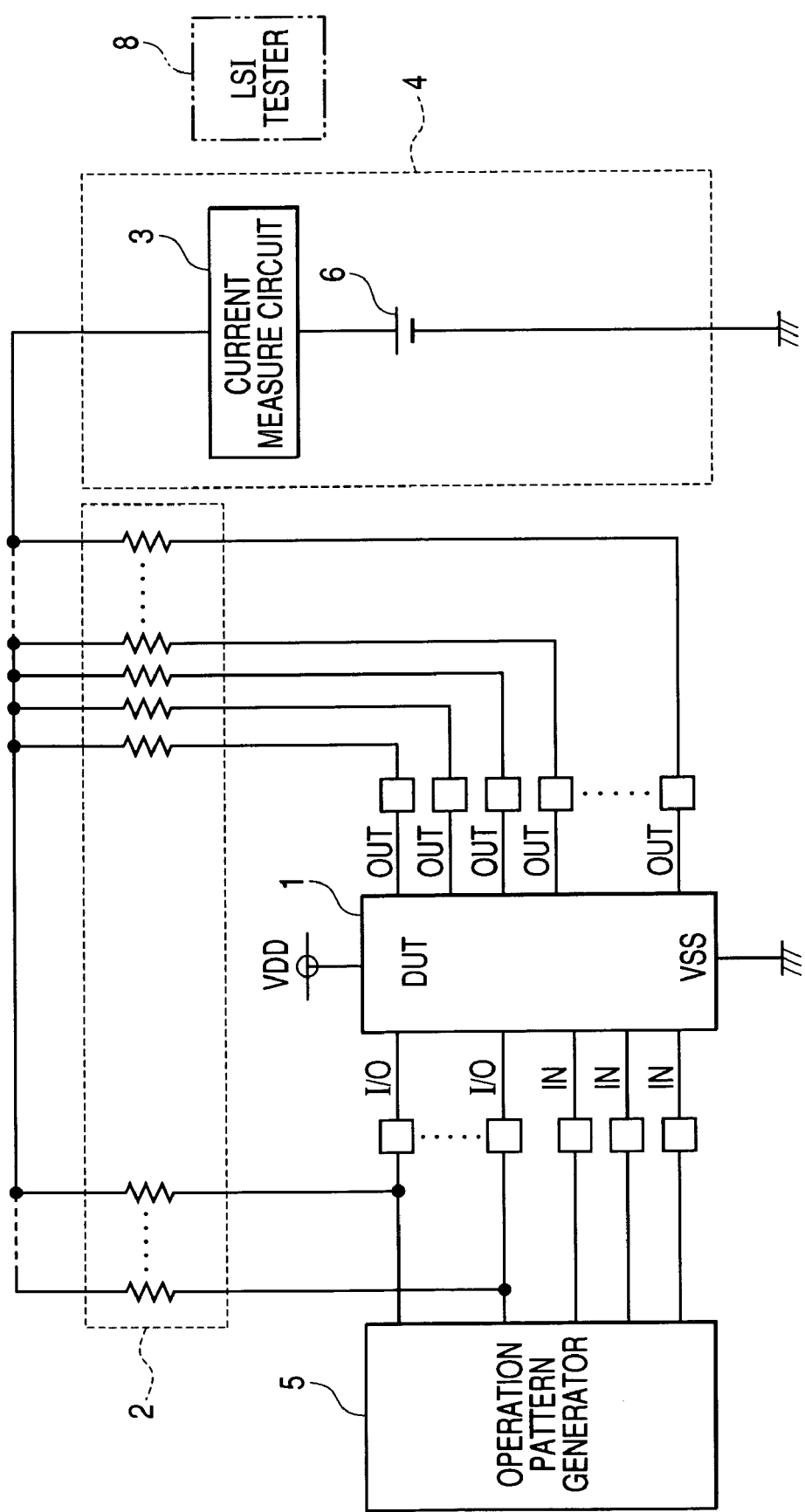
FIG. 1 is a block diagram, partly in circuit diagram, showing a configuration of a semiconductor integrated circuit testing device according to Embodiment 1 of the present invention.

FIG. 1 is a block diagram, partly in circuit diagram, showing a configuration of a semiconductor integrated circuit testing device according to Embodiment 1 of the present invention.

Referring to FIG. 1, reference numeral 1 designates a semiconductor integrated circuit (DUT) including a logic circuit becoming an object of a test. Output terminals (OUT) and input-output terminals (I/O) of the DUT 1 are all connected to a voltage application circuit 4 through a resistor unit 2. The resistor unit 2 includes a plurality of resistors which are connected in parallel to one another and which have the same resistance values. One terminals of a plurality of resistors are connected to the output terminals and the input-output terminals of the DUT 1, respectively, and the other terminals thereof are all short-circuited to be connected to the voltage application circuit 4. The voltage application circuit 4 includes a D.C. power supply 6 having a grounded minus terminal, and a current measure circuit 3 provided between a plus terminal of the D.C. power supply 6 and the resistor unit 2. The voltage application circuit 4 is adapted to output the same potential as that at a power supply voltage VDD terminal of the DUT 1.

Reference numeral 5 designates an operation pattern generator. The operation pattern generator 5 generates a pattern signal (a logic signal at a level of 0 or 1) of a predetermined operation pattern which is determined in configuration based on use in a machinery including a DUT as one constituent element, and which is used to test functions of the DUT to output the pattern signal of the predetermined operation pattern to the input terminals (IN) of the DUT 1 and the input-output terminals (I/O) in the input state. As a result, in a stationary state (a state after an operation state makes transition from a transient state to a stable state) for each operation step of the predetermined operation pattern, output logic signals (0, 1) are output from the respective output terminals (OUT) of the DUT 1. In this state, the current measure circuit 3 measures a total sum of currents which are caused to flow through the resistors of the resistor unit 2 connected to the output terminals (OUT) and the input-output terminals (I/O) of the DUT 1, respectively. Note that the voltage application circuit 4 including the current measure circuit 3 and the operation pattern generator 5 are configured in the form of an LSI tester 8. The LSI tester 8 includes an information processing function for preservation, comparison and the like of the measured results which will be described later.

On the other hand, a semiconductor integrated circuit which has the same function as that of the DUT 1 and for which its normal operation is verified through the input of the predetermined operation pattern (hereinafter referred to as "a non-defective") is connected instead of the DUT 1 to the semiconductor integrated circuit testing device. In this state, the current measure circuit 3 measures a total sum of currents which are caused to flow through the resistors of the resistor unit 2 in advance every operation step of the predetermined operation pattern in the configuration shown in FIG. 1. The measured results are then stored in the LSI tester 8. Then, the LSI tester 8 compares the measured results which are obtained in DUT 1 with the measured results which are previously obtained using this non-defective sample every operation step.

Note that the predetermined operation pattern the pattern signal of which is input to the DUT 1 and the non-defective sample heed not be one for which an output expected value which is previously obtained through the logic simulation. In addition, the current measure circuit 3 has measure resolution for a value of a current which is caused to flow through one resistor constituting the resistor unit 2 and which is calculated from a value of the voltage output from the voltage application circuit 4, and a value of the one resistor, and also has a measure range capable of covering a current value which is obtained by multiplying the value of the current caused to flow through the one resistor by the total number of resistors constituting the resistor unit 2.

Figure 2:
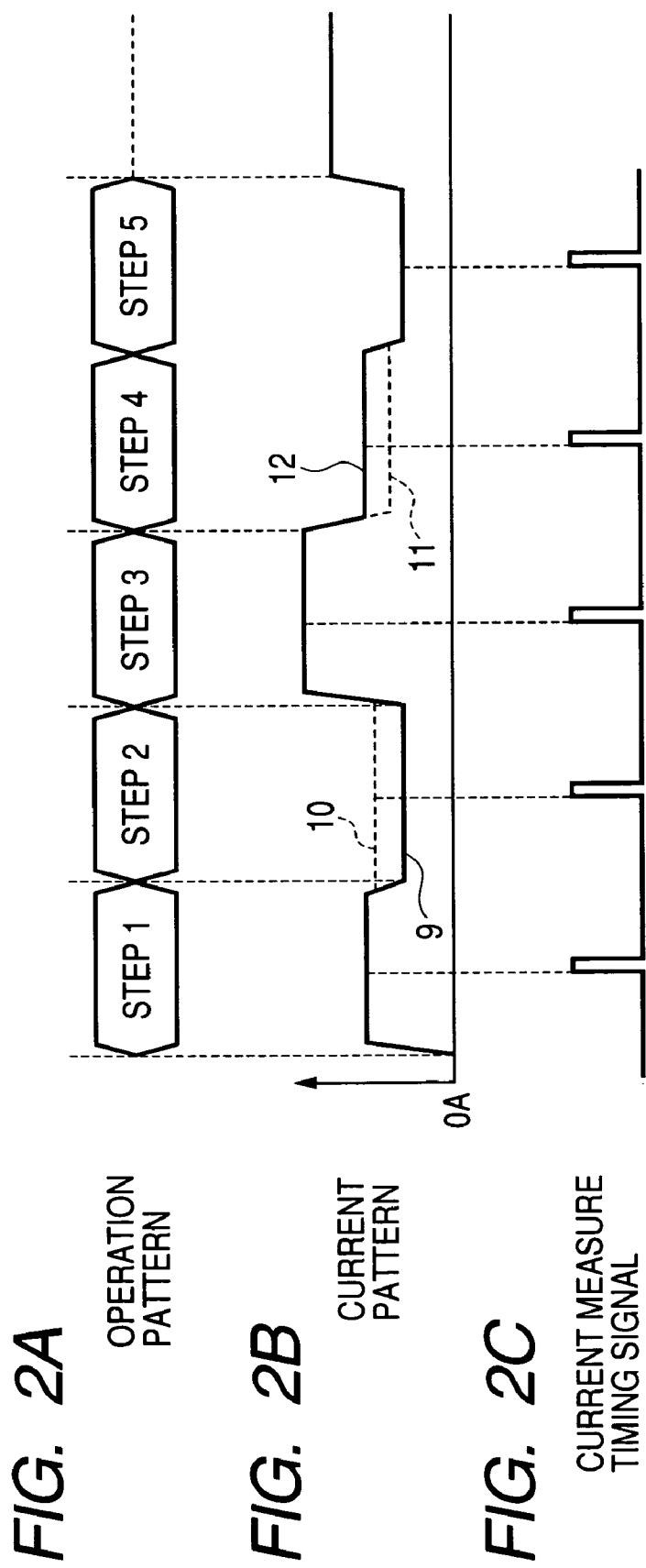
FIGS. 2A, 2B and 2C are timing charts showing a predetermined operation pattern generated from an operation pattern generator, and a current value measured by a current measure circuit.

FIGS. 2A to 2C are timing charts showing the predetermined operation pattern generated from the operation pattern generator 5 and the current values measured by the current measure circuit 3.

In FIGS. 2A to 2C, FIG. 2A shows the operation pattern input from the operation pattern generator 5 to the DUT 1, FIG. 2B shows a pattern of a total sum of currents caused to flow through the resistor unit 2 (hereinafter referred to as "current pattern"), and FIG. 2C shows a current measure timing signal. The current measure is carried out by the current measure circuit 3 in accordance with the current measure timing signal.

The current measure timing signal is set so as to be generated in the stationary state in each of the operation steps of the operation pattern. The current measure circuit 3 carries out the current measure for the non-defective sample and the DUT 1 in accordance with the current measure timing signal, and the LSI tester 8 compares both the current values which are measured every operation step by the current measure circuit 3.

Next, a description will hereinafter be given to the current values which are measured by the current measure circuit 3 in each of the operation steps. That is, the voltage of the voltage application circuit 4 on the resistor unit 2 side is made equal to that at the power supply voltage VDD terminal of the DUT 1. Here, the currents are caused to flow through only the resistors constituting the resistor unit 2, which are connected to the output terminals at each of which the output logic has 0 (the output voltage becomes a low level) of the output terminals (OUT) of the DUT 1 in each of the operation steps, and-to the input-output terminals at each of which the output logic goes to 0 in the input-output terminals (I/O) of the DUT 1 each of which becomes the output state in each of the operation steps. Thus, the current value measured by the current measure circuit 3 becomes a value which is obtained by multiplying the value of the current caused to flow through one resistor constituting the resistor unit 2 by a sum of the number of output terminals and the number of input-output terminals.

When the operation step exists in which the current value related to the DUT 1 and measured by the current measure circuit 3 is different from that related to the non-defective sample, this means that the total number of terminals each having logic 0 of the DUT 1 in that operation step is different from that of the non-defective sample. Thus, this means that the terminals exist at each of which the output logic is different from that at each of the corresponding terminals of the non-defective sample, and thus the DUT 1 is a defective.

For example, in an operation step 2 of the current pattern shown in FIG. 2B, reference numeral 9 designates a current pattern in a non-defective sample, and reference numeral 10 designates a current pattern in the DUT 1. Also, in an operation step 4, reference numeral 11 designates a current pattern in the DUT 1, and reference numeral 12 designates a current pattern in the non-defective sample. In the operation step 2, the current value in the DUT 1 is larger than that in the non-defective sample. This means that the number of terminals each having the output logic 0 in the DUT 1 is larger than that in the non-defective sample. In addition, in the operation step 4, the current value in the DUT 1 is smaller than that in the non-defective sample. This means that in the operation step 4, the number of terminals each having the output logic 0 in the DUT 1 is smaller than that in the non-defective sample. Thus, it is detected from the difference in current pattern that the DUT 1 is different from the non-defective sample in the two operation steps 2 and 4.

As described above, in Embodiment 1, all the output terminals and the input-output terminals of the DUT 1 are connected to the voltage generation circuit including the current measure circuit 3 through a plurality of resistors having the same resistance value, respectively. In this state, a total sum of values of currents caused to flow through a plurality of resistors, respectively, is compared with a total sum of current values in a non-defective sample of a DUT every operation step of the predetermined operation pattern to judge whether the DUT is a non-defective or a defective. As a result, it becomes possible to judge whether a semiconductor integrated circuit including a logic circuit is a non-detective or a defective without obtaining an output expected value of the operation pattern by carrying out the simulation in advance as in the related art.

Note that in Embodiment 1 described above, as in Embodiment 2 which will be described later, the output terminals and the input-output terminals of the DUT may be divided into a plurality of blocks, and the measure and comparison of the currents may be carried out every block. In addition, as in Embodiment 3 which will be described later, the block division may be repeatedly carried out to narrow output abnormal terminals of the DUT.

Embodiment 2

In Embodiment 1, the pattern signal of the predetermined operation pattern is input to the DUT, and the number of terminals of the DUT at each of which the output logic goes to 0 accordingly is compared with the number of terminals at each of which the output logic goes to 0 in correspondence to the same predetermined operation pattern input to the non-defective sample every operation step of the predetermined operation pattern to judge whether the DUT is a non-defective or a defective.

In the above-mentioned comparison with respect to the number of terminals, more specifically, a total sum of values of the currents caused to flow through the resistors which are connected to the output terminals and the input-output terminals (in the output state) of the DUT, respectively, in the stationary state for each operation step is compared with a total sum of values of such currents in the non-defective sample, thereby judging whether the DUT is a non-defective or a defective.

Now, in Embodiment 1, in a case where the output logic 0 is output to the output terminals (including the input-output terminals in the output state) at each of which the output logic must have 1, and at the same time, the output logic 1 is output to the output terminals at each of which the output logic must have 0, and also the number of terminals each having the output logic 0 output thereto is equal to that of terminals each having the output logic 1 output thereto, the DUT concerned is misjudged to be a non-defective though it must be essentially judged to be a defective. This results from that all the resistance values of the resistors which are connected to the output terminals and the input-output terminals of the DUT, respectively, are equal to one another. Thus, Embodiment 2 aims at preventing such misjudgment.

Figure 3:
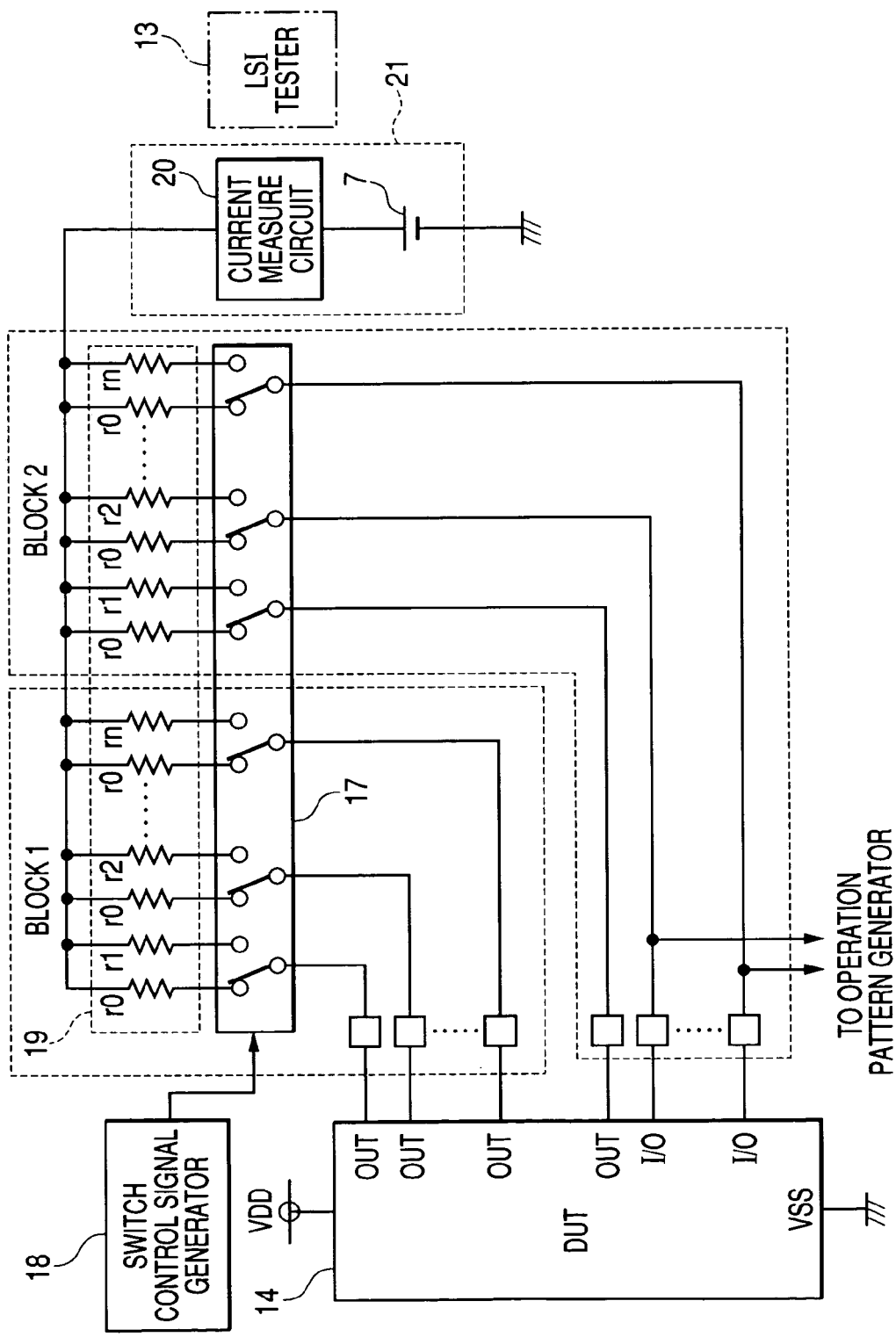
FIG. 3 is a block diagram, partly in circuit diagram, showing a configuration of a semiconductor integrated circuit testing device according to Embodiment 2 of the present invention.

FIG. 3 is a block diagram, partly in circuit diagram, showing a configuration of a semiconductor integrated circuit testing device according to Embodiment 2 of the present invention.

Referring to FIG. 3, reference numeral 14 designates a semiconductor integrated circuit (DUT) including a logic circuit becoming an object of a test. All output terminals (OUT) and input-output (I/O) of the DUT 14 are connected to a voltage application circuit 21 through a switch 17 and a resistor unit 19. The resistor unit 19, every block which will be described later, includes n resistors having the same resistance value r0, and n resistors having different resistance values r1 to rn which are connected in parallel to each other. One terminals of the 4n resistors are connected to terminals on one side of the switch 17, respectively, and the other terminals thereof are all short-circuited to be connected to the voltage application circuit 21. Terminals on the other side of the switch 17 are connected to input terminals and input-output terminals of the DUT 1, respectively. The output terminals and the input-output terminals of the DUT 14, and the switch 17 and the resistor unit 19 are divided every n terminals of the DUT 14, e.g., divided into two blocks (blocks 1 and 2).

The switch 17 is constituted by relays and the like, and takes three connection forms every block in accordance with a signal generated from a switch control signal generator 1. For example, giving a description to the block 1 as an example, in a first connection form, the output terminals (OUT) of the DUT 14 belonging to the block 1 are connected to the n resistors having the same resistance value r0, respectively. In a second connection form, the output terminals of the DUT 14 belonging to the block 1 are connected to the n resistors having different resistance values r1 to rn, respectively. Also, in a third connection form, the output terminals of the DUT 14 belonging to the block 1 are not connected to any of the resistors. In the block 2 as well, the same connection forms are taken. However, a point of difference from the block 1 is that the terminals of the DUT 14 belonging to the block 2 are the output terminals (OUT) and the input-output terminals (I/O). Note that the switch 17 can select simultaneously the connection forms different between the blocks 1 and 2.

The voltage application circuit 21 includes a D.C. power supply 7 having a grounded minus terminal, and a current measure circuit 20 provided between a plus terminal of the D.C. power supply 7 and the resistor unit 19. The voltage application circuit 21 outputs the same voltage as that at a power supply voltage VDD terminal of the DUT 14.

An operation pattern generator in Embodiment 1 is the same in configuration as that in Embodiment 1. Hence, the operation pattern generator generates a pattern signal of a predetermined operation pattern determined based on use in a machinery including a DUT as one constituent element to output the signal to input terminals (not shown) and the input-output terminals (I/O) of the DUT 14. Note that this predetermined operation pattern, similarly to Embodiment 1, is also one for which an output expected value does not need to be previously obtained through the logic simulation.

The current measure circuit 20 measures a total sum of values of currents caused to flow through the resistors of the resistor unit 19, respectively. Note that the voltage application circuit 21 including the current measure circuit 20, the operation pattern generator, and the switch control signal generator 18 are configured in the form of an LSI tester 13. The LSI tester 13 has an information processing/control function for preservation of the measured results obtained in the current measure circuit 20, comparison thereof, operation control for the switch 17, and the like.

Figure 4:
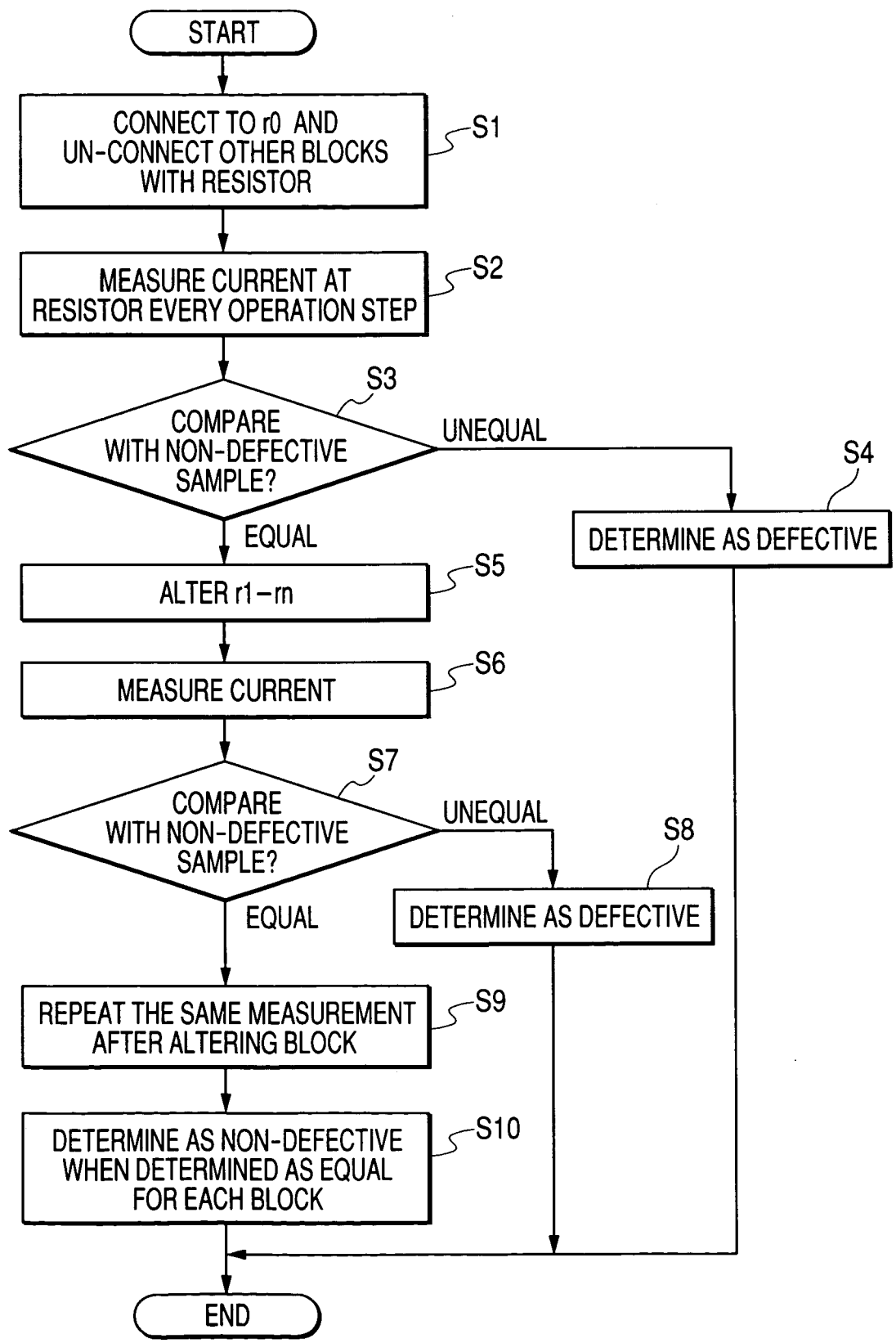
FIG. 4 is a flow chart showing a procedure of a test processing for a semiconductor integrated circuit (DUT) executed in an LSI tester in Embodiment 2 of the present invention.

FIG. 4 is a flow chart showing a procedure of a test processing for the DUT which is executed in the LSI tester 13 in Embodiment 2.

First of all, in Step S1, a switch control signal in accordance with which the control is carried out so that in the block 1, the switch 17 takes the first connection form, and in the block 2, the switch 17 takes the third connection form is output from the switch control signal generator 18 to the switch 17. As a result, the output terminals (OUT) belonging to the block 1 of the DUT 14 are connected to the resistors each having the same resistance value r0 of the resistor unit 19 belonging to the block 1, respectively. On the other hand, the output terminals (OUT) and the input-output terminals (I/O) of the DUT 14 belonging to the block 2 are not connected to any of the resistors through the switch 17.

In Step S2, the pattern signal of the predetermined operation pattern is output from the operation pattern generator to the input terminals (not shown in FIG. 4) and the input-output terminals of the DUT 14. Then, in the stationary state in each of the operation steps of the predetermined operation pattern, a total sum of values of the currents caused to flow through the resistors of the resistor unit 19 which are connected to the output terminals and the input-output terminals (in the case of the block 2) of the DUT 14, respectively, is measured by the current measure circuit 20. Note that, the current measure circuit 20 has the measure resolution with which the amounts of currents caused to flow through the respective resistors constituting the resistor unit 19 can be identified and detected, and has also the measure range capable of covering a total sum of values of the currents caused to flow through the respective resistors constituting the resistor unit 19.

Next, in Step S3, the current value for each operation step measured in Step S2 is compared with the current value for each operation step which is previously measured in accordance with the same procedure as that in Step S2 using a non-defective sample instead of the DUT 14. When the comparison results show that the operation steps exist in each of which the current value of the DUT is different from that of the non-defective sample, the operation proceeds to Step S4 to judge that the DUT 14 is a defective.

On the other hand, when the comparison results show that no operation step exists in which the current value of the DUT is different from that of the non-defective sample, the operation proceeds to Step S5. In Step S5, the switch control signal in accordance with which the control is carried out so that in the block 1, the switch 17 takes the second connection form, and in the block 2, the switch 17 takes the third connection form is output from the switch control signal generator 18 to the switch 17. As a result, the output terminals (OUT) belonging to the block 1 of the DUT 14 are connected to the resistors having the different resistance values r1 to rn of the resistor unit 19 belonging to the block 1, respectively. On the other hand, the output terminals (OUT) and the input-output terminals (I/O) of the DUT 14 belonging to the block 2 are not connected to any of the resistors through the switch 17.

In Step S6, the pattern signal of the same predetermined operation pattern as that in Step S2 is input from the operation pattern generator to the DUT 14. Then, in the stationary state for each operation step of the predetermined operation pattern, a total sum of values of the currents caused to flow through the resistors of the resistor unit 19 connected to the output terminals and the input-output terminals (in the case of the block 2) of the DUT 14, respectively, is measured by the current measure circuit 20.

Next, in Step S7, the current value for each operation step measured in Step S6 is compared with the current value for each operation step which is previously measured in accordance with the same procedure as that in Step S6 using a non-defective sample instead of the DUT 14. When the comparison results show that the operation steps exist in each of which the current value of the DUT is different from that of the non-defective sample, the operation proceeds to Step S8 to judge that the DUT 14 is a defective.

On the other hand, when the comparison results show that no operation step exists in which the current value of the DUT is different from that of the non-defective sample, the operation proceeds to Step S9. In Step S9, the same processing as that in Steps S1 to S8 is executed for each of other blocks. That is to say, when two blocks exist as in Embodiment 2, and the processing of Steps S1 to S8 is executed for the block 1, the same processing as that of Steps S1 to S8 is executed for the block 2 next time. In this case, the control is carried out so that in the block 1, the switch 17 takes the third connection form.

After the same processing as that of Steps S1 to S8 is executed for all the blocks, the operation proceeds to next Step S10. Then, when in all the blocks, the measure results of the DUT 14 agree with those of the non-defective sample, the DUT 14 is judged to be a non-defective.

Thus, in a case where the output logic 0 is output to the output terminals at each of which the output logic must have 1, and at the same time, the output logic 1 is output to the output terminals at each of which the output logic must have 0, and also the number of terminals each having the output logic 0 output thereto is equal to that of terminals each having the output logic 1 output thereto, the DUT is misjudged to be a non-defective though it should be essentially judged to be a defective in Embodiment 1. In such a case, however, in Embodiment 2, the switch 17 is controlled so as to take the second connection form, whereby the resistance values of the resistors connected to the output terminals and the input-output terminals of the DUT, respectively, can be switched over to the different resistance values r1 to rn, which results in that the amounts of currents caused to flow through the resistors, respectively, become different from one another. Consequently, even when the number of terminals in the DUT is equal to that of terminals in the non-defective sample, a total sum of values of the currents caused to flow through the resistors in the DUT, respectively, is different from that in the non-defective sample. Thus, in Embodiment 2, the misjudgment in Embodiment 1 can be prevented.

Consequently, in a case where even if a total sum of values of the currents caused to flow through the resistors in the DUT, respectively, is equal to that in the non-defective sample in the measure when the resistance values of the resistors are different from one another, the number of terminals in the DUT is different from that in the non-defective sample in the measure when the resistance values of the resistors are equal to one another (in a case where a total sum of values of the currents caused to flow through the respective resistors in the DUT is different from that in the non-defective sample), the DUT is judged to be a defective.

In such a manner, in Embodiment 2, since the current measure is carried out for both the case where the resistance values of the resistors are equal to one another and the case where the resistance values of the resistors are different from one another, it can be surely carried out to judge whether the DUT is a non-defective or a defective.

Note that in the current measure when the resistance values of the resistors are made different from one another in the resistor unit 19, a value of the current caused to flow through the resistor having the high resistance value becomes small. In order that the current measure circuit 20 having the predetermined measure resolution and measure range may be able to identify and detect a minimum value of the current caused to flow through the resistor having the highest resistance value and may be able to measure a total sum of values of the currents caused to flow through the respective resistors, it is necessary to limit the number of terminals of the DUT as an object of the measure. In order to attain this, in Embodiment 2, all the output terminals and the input-output terminals of the DUT are divided into a plurality of blocks, and the current measure is carried out every block. Thus, the number of blocks for division is determined from the total number of output terminals and input-output terminals of the DUT. When even if the terminals are not divided into blocks, the current measure circuit 20 can identify and detect a minimum value of the current caused to flow through the resistor having the highest resistance value and can measure a total sum of values of currents caused to flow through the respective resistors, all the output terminals and the input-output terminals of the DUT do not need to be divided into blocks.

Embodiment 3

Next, Embodiment 3 of the present invention will hereinafter be described. Since a configuration of Embodiment 3 is basically the same as that of Embodiment 2, the configuration of Embodiment 2 will be diverted to the description of Embodiment 3.

In Embodiment 3, the block of the DUT which is judged to be a defective in Step S4 or Step S8 of the flow chart of Embodiment 2 shown in FIG. 4 is further repeatedly divided into blocks to narrow a defective terminal.

Figure 5:
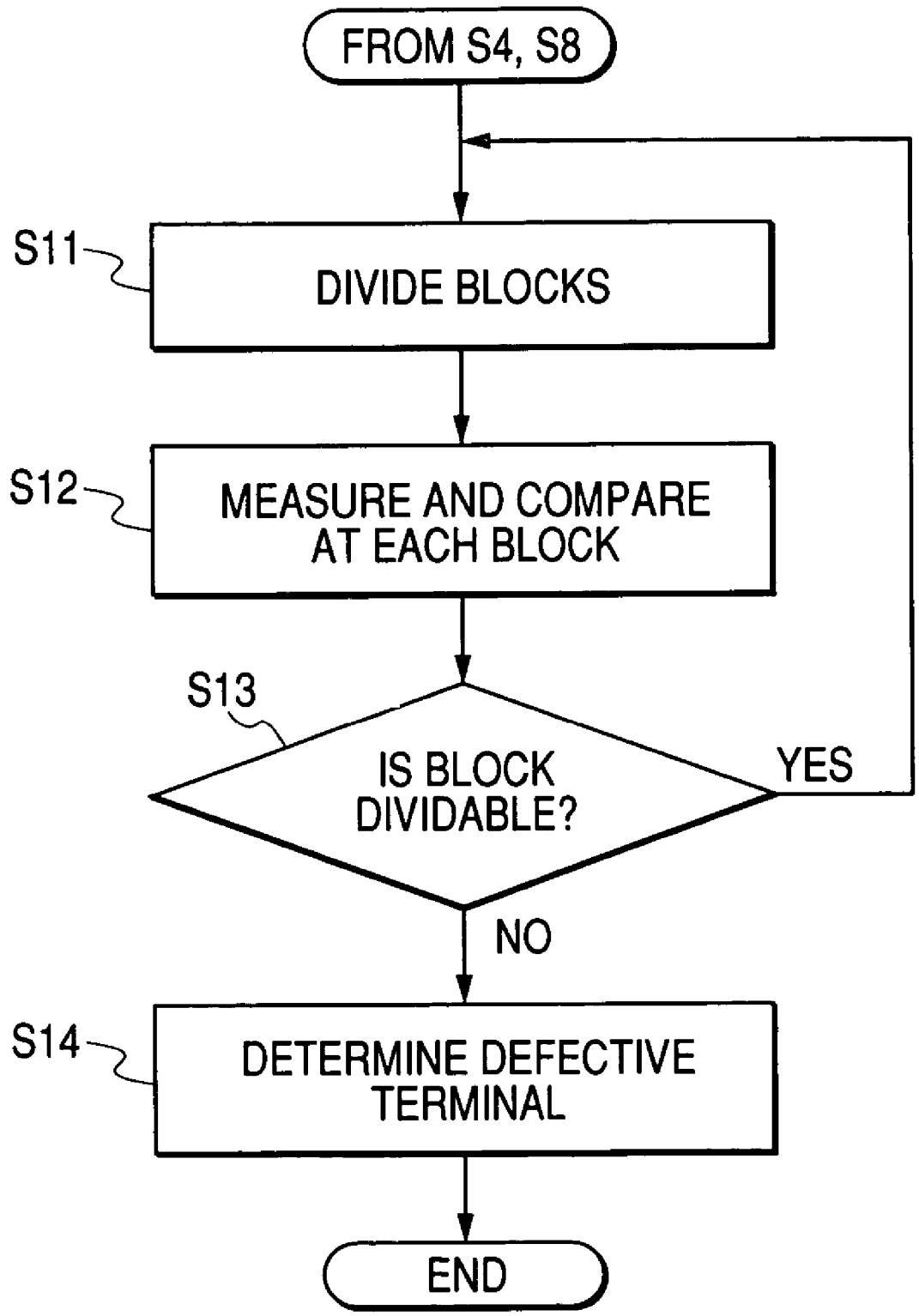
FIG. 5 is a flow chart showing a procedure for narrowing a defective terminal in Embodiment 3 of the present invention.

FIG. 5 is a flow chart showing a procedure for narrowing a defective terminal in Embodiment 3.

Steps S11 to S14 in the flow chart are executed after execution of Step S4 or Step S8 of the flow chart of Embodiment 2 shown in FIG. 4.

First of all, in Step S11, the block of the DUT which is judged to be defective in Step S4 or Step S8 in Embodiment 2 is further divided into a plurality of blocks.

In next Step S12, the same current measure and comparison as those in Steps S1 to S9 of Embodiment 2 shown in FIG. 4 are carried out for the blocks obtained through block division in Step S11 to specify a defective block.

In Step S13, it is judged whether or not the defective block specified in Step S11 is further dividable. That is to say, it is judged whether or not a plurality of terminals of the DUT exist within the defective block and are dividable. When it is judged in Step S13 that the defective block is further dividable, the operation is returned back to Step S11. On the other hand, when it is judged in Step S13 that the defective block is not dividable any more, the operation proceeds to Step S14 to determine that a defective terminal exists in the terminals of the DUT included in the defective block specified in Step S11.

Embodiment 4

In order to increase measure precision (S/N ratio) in the current measure circuit 3 in Embodiment 1, it is conceivable that the small resistance values are set in the resistors constituting the resistor unit 2, and in this state, there is made large a difference between a value of a current caused to flow through one resistor of the resistors when the logic output 1 (high level output signal) is output from the corresponding output terminal or input-output terminal of the DUT and a value of a current caused to flow through the one resistor when the logic output 0 (low level output signal) is output from the corresponding output terminal or input-output terminal of the DUT. However, in this case, there is a limit to the output current per terminal of the DUT, and hence the output current required to obtain the S/N ratio necessary for the measure may not be obtained in some cases. In addition, it is conceivable that even when the output current per terminal is within a limit in the DUT, if all the output currents from the output terminals and the input-output terminals are made large, all the output currents are beyond a limit of power consumption of the DUT, and the output current cannot be made large. In Embodiment 4, such a problem is solved.

Figure 6:
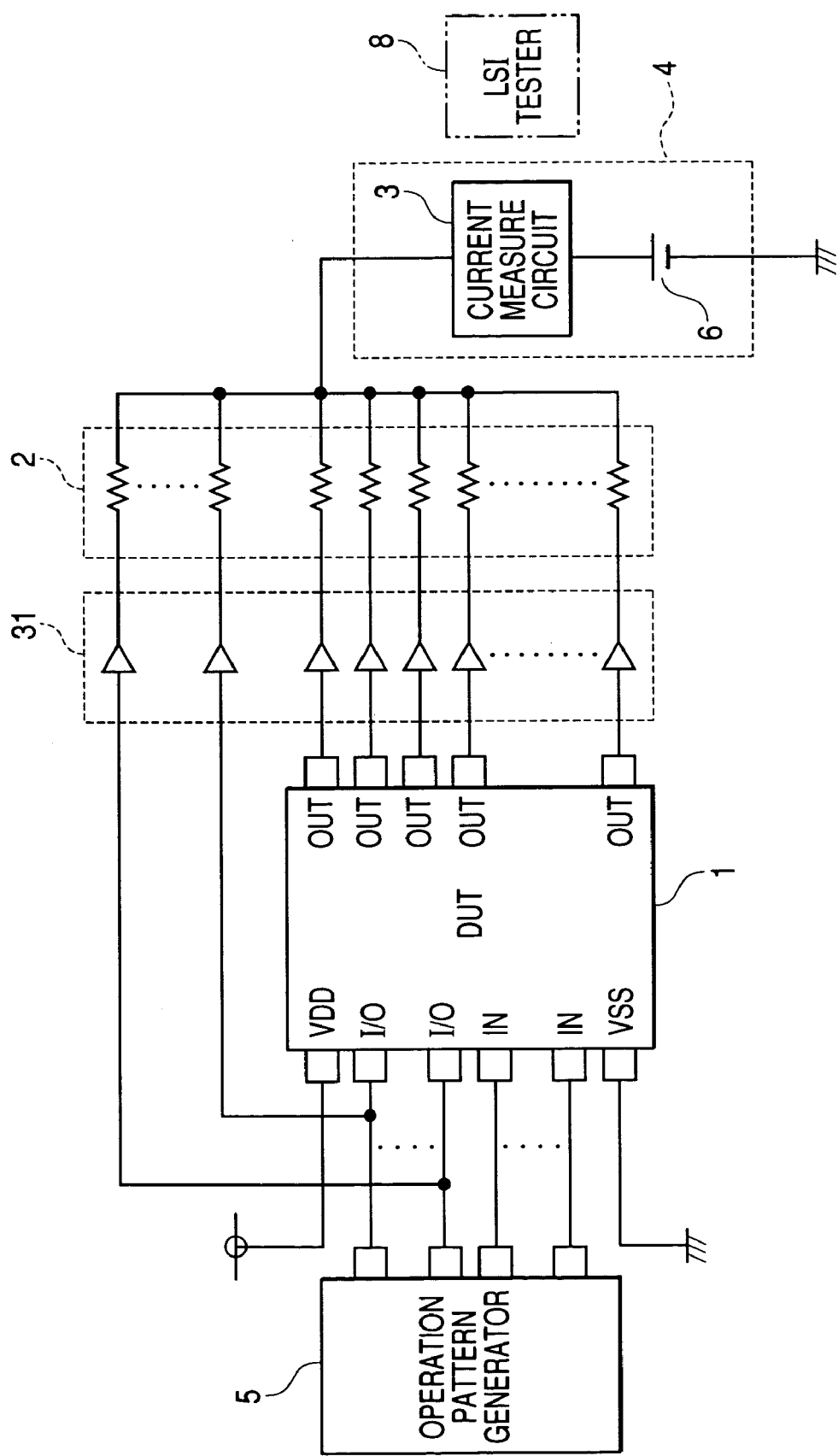
FIG. 6 is a block diagram, partly in circuit diagram, showing a configuration of a semiconductor integrated circuit testing device according to Embodiment 4 of the present invention.

FIG. 6 is a block diagram, partly in circuit diagram, showing a configuration of a semiconductor integrated circuit testing device according to Embodiment 4 of the present invention.

Since a configuration of Embodiment 4 is basically the same as that of Embodiment 1, the same constituent elements are designated with the same reference numerals, and their descriptions are omitted here for the sake of simplicity.

In Embodiment 4, a buffer unit 31 is newly provided between all the output terminals (OUT) and the input-output terminals (I/O) of the DUT 1, and the resistor unit 2. The buffer unit 31 is constituted by a plurality of buffers which are individually connected to the output terminals (OUT) and the input-output terminals (I/O) of the DUT 1, respectively. The buffers are connected to a plurality of resistors constituting the resistor unit 2, respectively.

The buffer unit 31 has a high input impedance and a low output impedance, and also includes a predetermined output ability to amplify an input signal voltage to output the resultant output signal voltage.

Since the buffer unit 31 has the high input impedance, a load side hardly exerts an influence on the output terminals and the input-output terminals of the DUT 1 connected to the buffer unit 31, and each of output currents of the DUT 1 becomes small. Thus, the power consumption of the DUT 1 does not exceed allowable power consumption.

In addition, since the buffer unit 31 has the high output ability, such resistors having respective resistances capable of exceeding the output ability of the output terminals and the input-output terminals of the DUT 1 as to be unable to be directly connected to the output terminals and the input-output terminals of the DUT 1 can be connected to the buffer unit 31. As a result, a difference between a value of a current caused to flow through one resistor of the resistor unit 2 when the logic output 1 (high level output signal) is output from the corresponding output terminal or input-output terminal of the DUT and a value of a current caused to flow through the one resistor when the logic output 0 (low level output signal) is output therefrom can be made large within a range of the output ability of the buffer unit 31.

Embodiment 5

In Embodiment 1, the outputs of the output terminals and the input-output terminals of the DUT 1 change in an unstable output state for a period of time required to reach a timing at which the current measure circuit 3 carries out the current measure. Thus, the currents which are caused to flow the respective resistors of the resistor unit 2 at the measure timing are not uniform, and also a total amount of values of the currents fluctuates with time. Thus, calorific values in the resistors are not uniform, and also a calorific value in the overall resistor unit 2 varies with time. Consequently, due to this calorification, the resistance values of the resistors of the resistor unit 2 become values which are different from the original values, respectively, and are also different from one another. In addition, since a total current which is caused to flow through the overall resistor unit 2 varies with time, and an amount of current caused to flow through the current measure circuit 3 fluctuates with time accordingly, a calorific value of the current measure circuit 3 also changes with time. Thus, an error due to the heat is contained in the measured value obtained by the current measure circuit 3. Thus, in Embodiment 1, both an error due to the fact that the resistance values of the resistors of the resistor unit 2 are mutually different owing to the heat in the resistors of the resistor unit 2, and a time measure error due to the heat of the current measure circuit 3 itself are contained in the measured value obtained by the current measure circuit 3.

In Embodiment 5, such a problem is solved.

Figure 7:
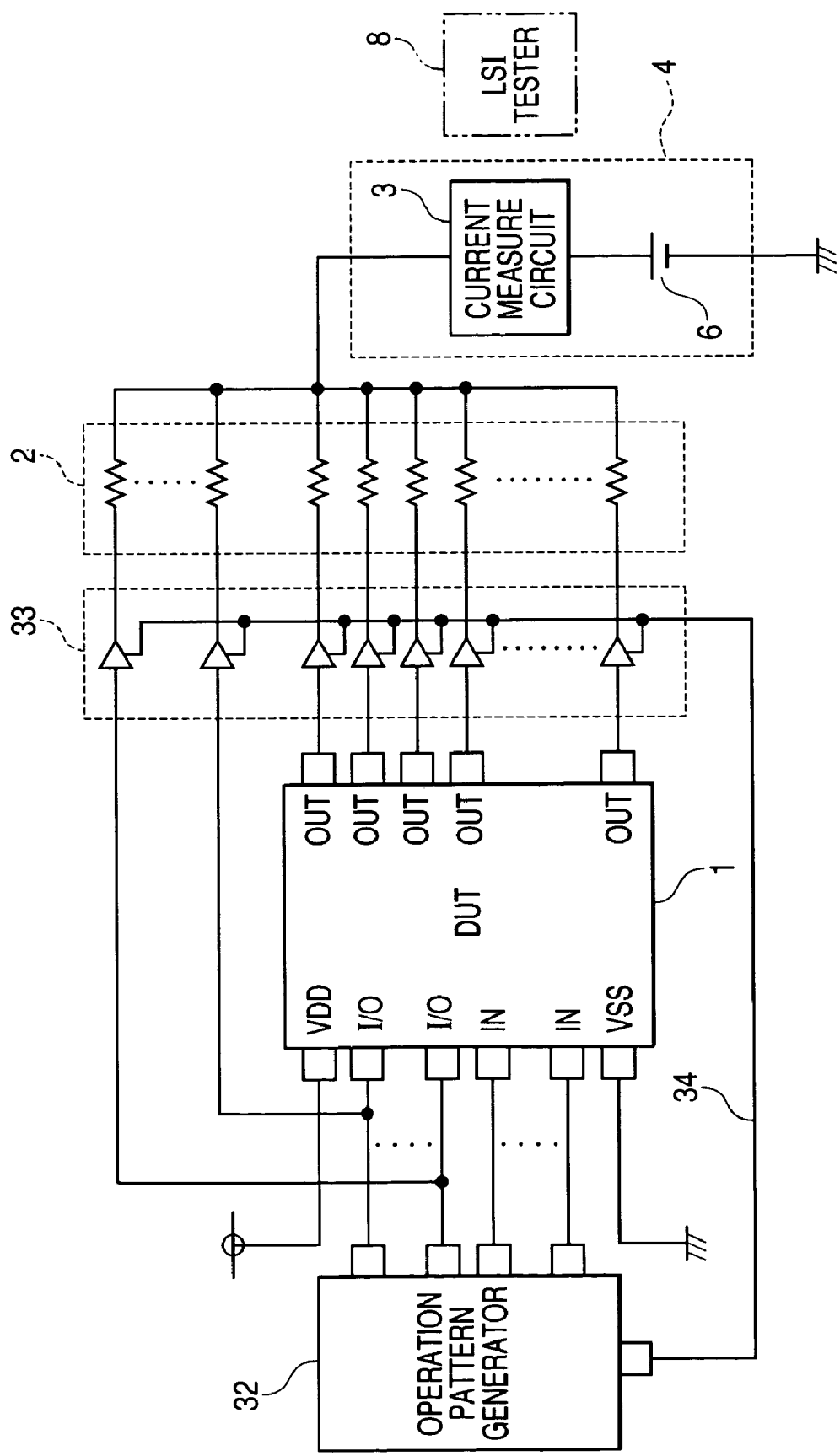
FIG. 7 is a block diagram, partly in circuit diagram, showing a configuration of a semiconductor integrated circuit testing device according to Embodiment 5 of the present invention.
Figure 8:
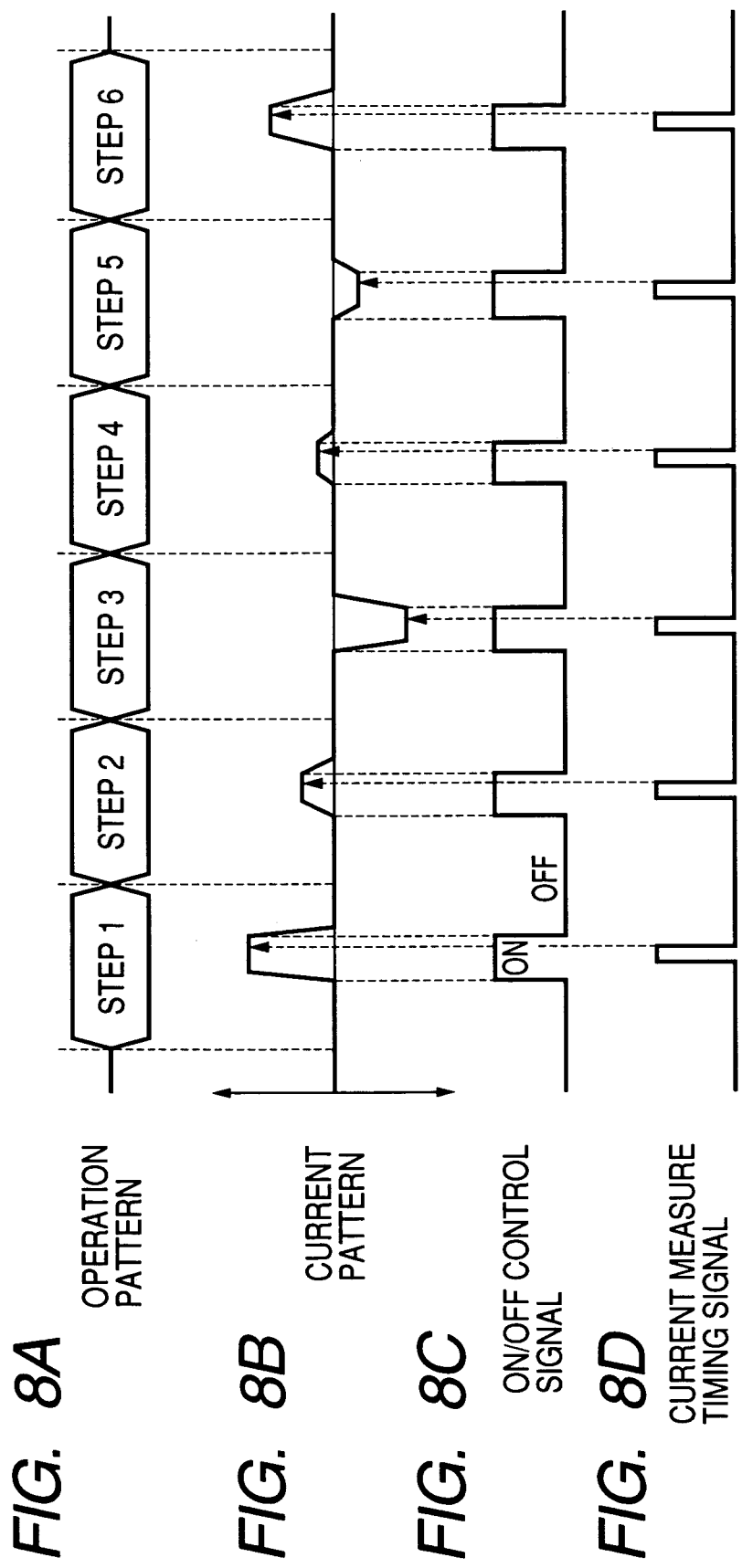
FIGS. 8A, 8B, 8C and 8D are timing charts showing a pattern of currents which are caused to flow through resistors in accordance with an ON/OFF control signal in Embodiment 5 of the present invention.

FIG. 7 is a block diagram, partly in circuit diagram, showing a configuration of a semiconductor integrated circuit testing device according to Embodiment 5 of the present invention.

Since a configuration of Embodiment 5 is basically the same as that of Embodiment 1, the same constituent elements are designated with the same reference numerals, and their descriptions are omitted here for the sake of simplicity.

In Embodiment 5 as well, similarly to Embodiment 4, a buffer unit 33 is newly provided between all the output terminals (OUT) and the input-output terminals (I/O) of the DUT 1, and the resistor unit 2. The buffer unit 33 is constituted by a plurality of buffers which are individually connected to the output terminals (OUT) and the input-output terminals (I/O) of the DUT 1, respectively. The buffers are connected to a plurality of resistors constituting the resistor unit 2, respectively. The buffer unit 33 has a high input impedance and a low output impedance, and also has a predetermined output ability to amplify an input signal voltage to output the resultant input signal voltage.

Moreover, the buffer unit 33 has a function for simultaneously outputting output signals from the buffers constituting the buffer unit 33 and simultaneously stopping the output signals therefrom (increasing the output impedances of the buffers) in accordance with an ON/OFF control signal sent thereto from the operation pattern generator 32 through a line 34.

The operation pattern generator 32, in addition to the same function as that of the operation pattern generator 5 of Embodiment 1, has a function for outputting the ON/OFF control signal synchronously with a current measure timing signal.

FIGS. 8A to 8D are timing charts showing a pattern of the currents which are caused to flow through the resistor unit 2 in accordance with the ON/OFF control signal in Embodiment 5.

The operation pattern generator 32 outputs a pattern signal of a predetermined operation pattern (FIG. 8A) to the DUT 1, and at the same time, outputs the ON/OFF control signal (FIG. 8C) to the buffer unit 33. An ON period of time of the ON/OFF control signal is set in a period of time for which the DUT 1 which has received as its input the pattern signal of the predetermining operation pattern (FIG. 8A) can output a signal of a relatively stable current pattern (FIG. 8B) in each of the operation steps. For this ON period of time, the current (current pattern) based on an output logic signal from the DUT 1 is caused to flow through the resistor unit 2. The current measure circuit 3 measures an amount of current at this time.

On the other hand, for an OFF period of time of the ON/OFF control signal, no current is caused to flow through the resistor unit 2 at all. For this reason, for the OFF period of time, the calorification based on the measured current is not generated in any of the resistor unit 2 and the current measure circuit 3. Thus, since the error of the current measured value in the current measure circuit 3 due to the calorification is cancelled, the comparison in total sum of values of the currents caused to flow through the resistor unit 2 between the DUT 1 and the non-defective sample can be more precisely carried out.

Embodiment 6

In Embodiment 3, in order to narrow the output abnormal terminal of the DUT which is judged to be defective, the switch 17 adapted to individually connect the DUT 1 and the resistors constituting the resistor unit 2 to each other is provided, and also a plurality of resistors having the different resistance values are added to the resistor unit 2, whereby the resistors of the resistor unit 2 to be connected to the DUT 1 can be individually selected by the switch 17. However, in the case of the configuration of Embodiment 3, there is encountered a problem that the circuit scale becomes necessarily large.

In Embodiment 6, such a problem is solved.

Figure 9:
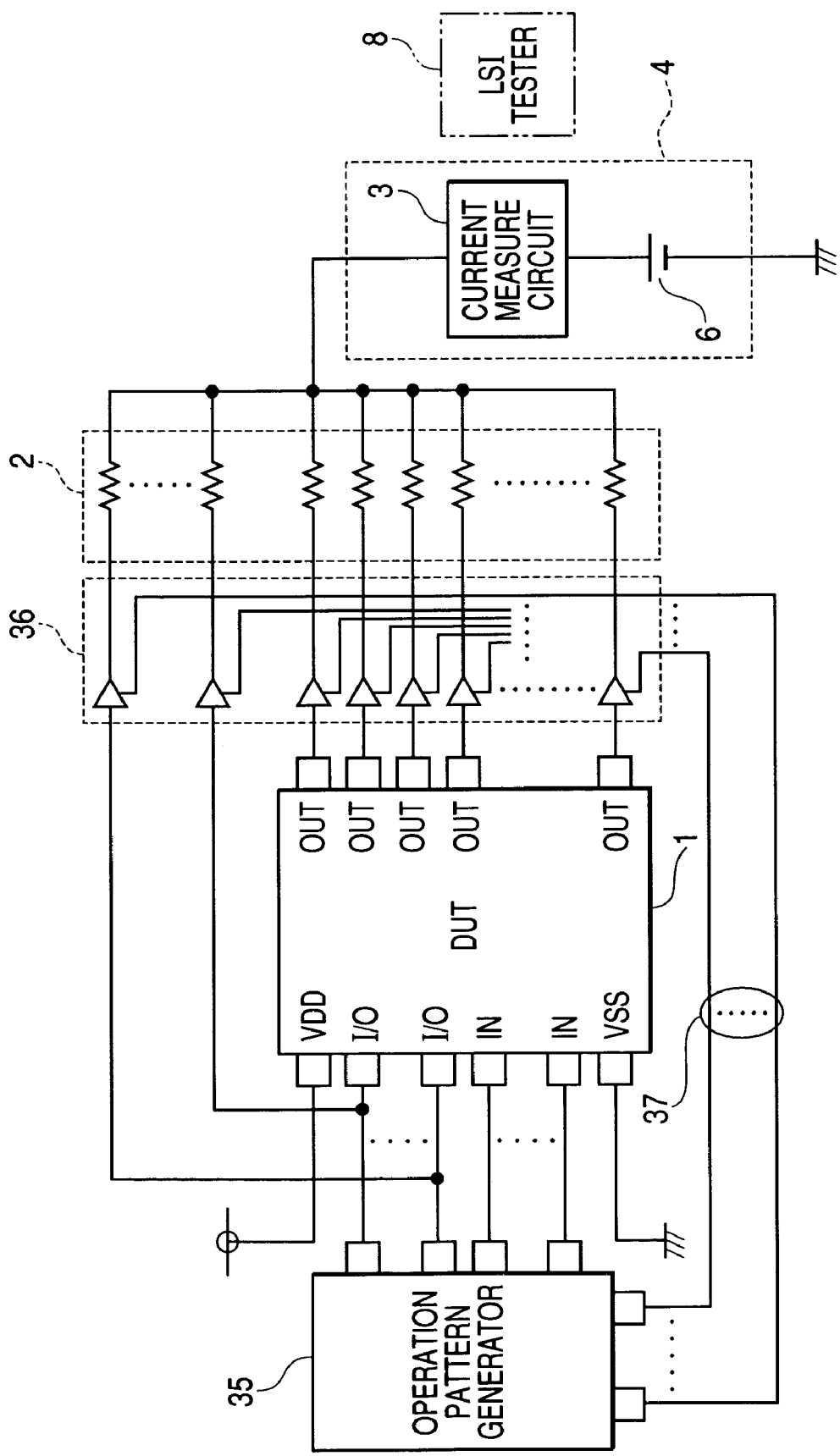
FIG. 9 is a block diagram, partly in circuit diagram, showing a configuration of a semiconductor integrated circuit testing device according to Embodiment 6 of the present invention.

FIG. 9 is a block diagram, partly in circuit diagram, showing a configuration of a semiconductor integrated circuit testing device according to Embodiment 6 of the present invention.

Since a configuration of Embodiment 6 is basically the same as that of Embodiment 1, the same constituent elements are designated with the same reference numerals, and their descriptions are omitted here for the sake of simplicity.

In Embodiment 6 as well, similarly to Embodiment 4, a buffer unit 36 is newly provided between all the output terminals (OUT) and the input-output terminals (I/O) of the DUT 1, and the resistor unit 2. The buffer unit 36 is constituted by a plurality of buffers which are individually connected to the output terminals (OUT) and the input-output terminals (I/O) of the DUT 1, respectively. The buffers are connected to a plurality of resistors constituting the resistor unit 2, respectively. The buffer unit 36 has a high input impedance and a low output impedance, and also has a predetermined output ability to amplify an input signal voltage to output the resultant input signal voltage.

Moreover, the buffer unit 36 has a function for individually outputting output signals from the buffers constituting the buffer unit 36 and individually stopping the output signals therefrom in accordance with ON/OFF control signals sent thereto from an operation pattern generator 35 through a plurality of lines 37.

The operation pattern generator 35, in addition to the same function as that of the operation pattern generator 5 of Embodiment 1, has a function for individually outputting the ON/OFF control signals to the buffers of the buffer unit 36 synchronously with a current measure timing signal.

FIGS. 10A to 10H are timing charts showing a pattern of currents caused to flow through the resistor unit 2 in accordance with the ON/OFF control signals, and a processing for narrowing an output abnormal terminal in Embodiment 6.

First of all, similarly to Embodiment 5, the ON/OFF control signals having the same signal form are simultaneously output to the respective buffers of the buffer unit 36 every operation step of the predetermined operation pattern to compare the current pattern in the DUT 1 with the current pattern in the non-defective sample. When the comparison results show that the current pattern in the DUT 1 is different from that in the non-defective sample in a certain operation step, in this operation step, an output abnormal terminal is narrowed as follows.

While the operation pattern generator 35 outputs the pattern signal of the operation pattern in the operation step having the different current pattern in the DUT 1 in the form of an operation pattern (FIG. 10A), the operation pattern generator 35 outputs successively the ON/OFF control signals each in an ON state to the buffers of the buffer unit 36, respectively (FIGS. 10D to 10G). ON/OFF control signals each in an OFF state are output to the remaining buffers other than the buffers to which the ON/OFF control signals each in the ON state are successively output. Then, the currents caused to flow through only the resistors connected to the buffers to which the ON/OFF control signals each in the ON state are successively output are measured by the current measure circuit 3, and the measured value (FIGS. 10C) is compared with a measured value (FIG. 10B) of the non-defective sample which is previously obtained in the same state to carry out output abnormality discrimination for the terminals of the DUT connected to the buffers to which the ON/OFF control signals each in the ON state are successively output.

Figure 10:
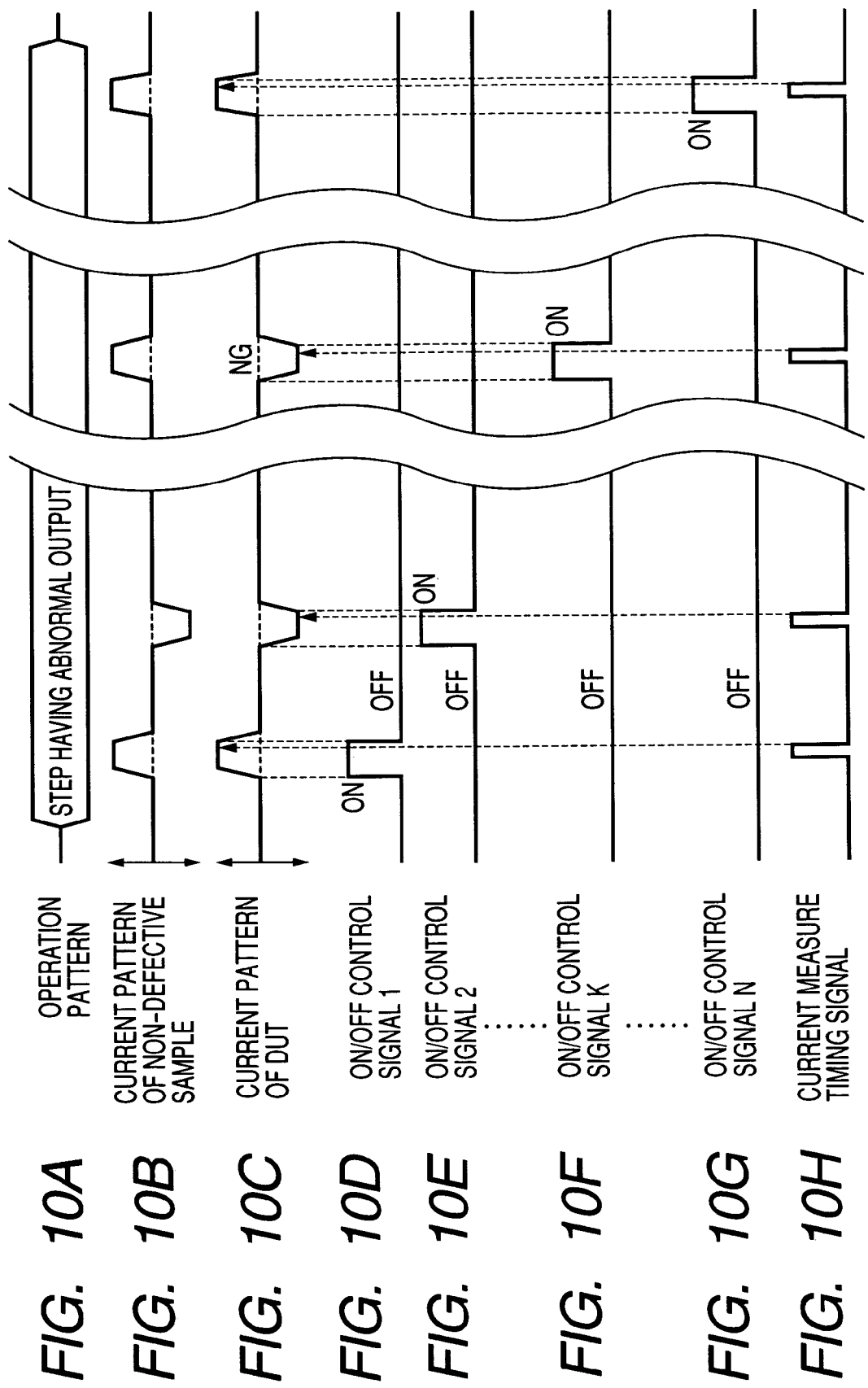
FIGS. 10A, 10B, 10C, 10D, 10E, 10F, 10G, and 10H are timing charts showing the pattern of the currents which are caused to flow through the resistors in accordance with ON/OFF control signals, and a processing for narrowing an output abnormal terminal in Embodiment 6 of the present invention.

When the current pattern (FIG. 10C) in the DUT 1 takes a value different from that taken by the current pattern (FIG. 10B) in the non-defective sample as shown in the form of a mark "NG" in the FIG. 10C, the buffer, corresponding to the different value in the current pattern, to which the ON/OFF control signal in the ON state is output is specified, thereby allowing the output terminal or the input-output terminal of the DUT 1 connected to that buffer to be specified as an output abnormal terminal.

With this specifying method, it is unnecessary to repeatedly input the pattern signal of the predetermined operation pattern to the DUT 1, and thus the ON/OFF control signal to be output from the operation pattern generator 35 has only to be manipulated while there is maintained the state in which the operation pattern enters the operation step having different measured values between the DUT 1 and the non-defective sample. Hence, it is possible to shorten the necessary time until the output abnormal terminal is specified.

Embodiment 7

Since a configuration of Embodiment 7 is basically the same as that of Embodiment 1, the configuration of Embodiment 1 will be diverted to a description of Embodiment 7.

In Embodiment 7, the resistor unit 2 can be exchanged for another resistor unit constituted by resistors having different resistance values, and the measure range of the current measure circuit 3 can be changed. In addition, a test processing executed by the LSI tester 8 is different from that in Embodiment 1.

In Embodiment 7, the current measure is carried out over all the operation steps of a predetermined operation pattern for a non-defective sample, a maximum current value and a minimum value of total sums of amounts of resultant currents for the operation steps are obtained, and two criterion zones are produced which have respective predetermined widths with the maximum current value and the minimum current value as respective central values based on the maximum current value and the minimum current value. Next, similarly, the current measure is carried out over all the operation steps of a predetermined operation pattern for a DUT, a maximum current value and a minimum value of total sums of amounts of resultant currents for the operation steps are obtained and it is judged whether or not the maximum current value and the minimum current value fall within the two criterion zones, respectively, to judge whether the DUT is a non-defective or a defective.

FIGS. 11A to 11D are timing charts showing a current pattern containing the two criterion zones in Embodiment 7.

Figure 11:
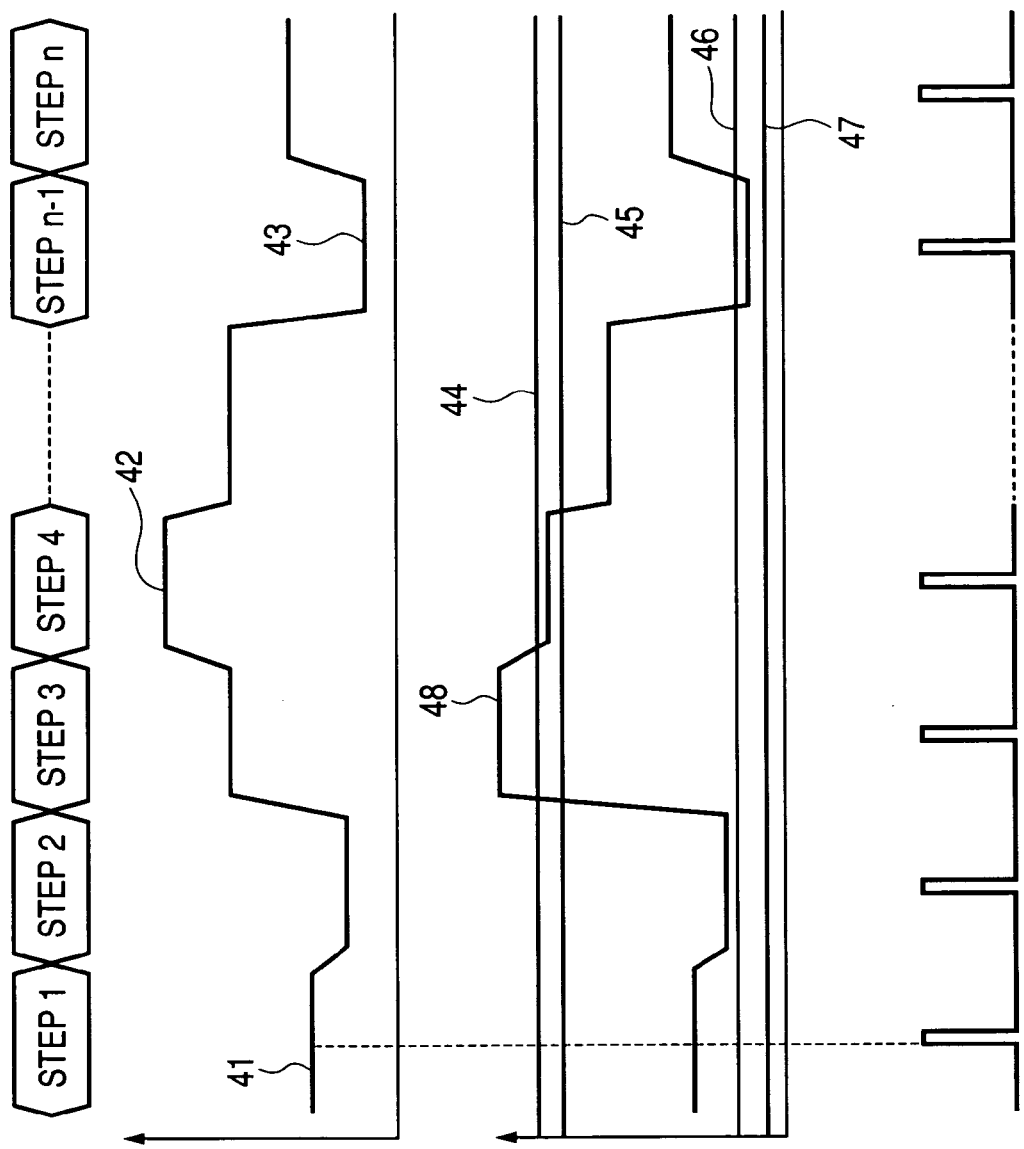
FIGS. 11A, 11B, 11C and 11D are timing charts showing a current pattern containing criterion zones in Embodiment 7 of the present invention.

Referring to FIGS. 11A to 11D, reference numeral 41 designates a current value obtained from a non-defective sample in an operation step 1 of the predetermined operation pattern shown in FIG. 11A. This current value is measured by the current measure circuit 3. Reference numeral 42 shown in FIG. 11B designates a maximum current value of the non-defective sample in a current pattern over the whole operation steps, and reference numeral 43 designates a minimum current value of the non-defective sample in the current pattern over all the operation steps. Reference numeral 44 shown in FIG. 11C designates an upper limit value of the maximum current value criterion zone determined based on the maximum current value 42, and reference numeral 45 designates a lower limit value of the maximum current value criterion zone. Also, reference numeral 46 designates an upper limit value of the minimum current value criterion zone determined based on the minimum current value 43, and reference numeral 47 designates a lower limit value of the minimum current value criterion zone.

The upper limit value 44 of the maximum current value criterion zone is a value which is obtained by adding, 50% of the value of the current caused to flow through one resistor of the resistor unit 2 to the maximum current value 42 of the non-defective sample. The lower limit value 45 of the maximum current value criterion zone is a value which is obtained by subtracting 50% of the value of the current caused to flow through one resistor of the resistor unit 2 from the maximum current value 42 of the non-defective sample. The upper limit value 46 of the minimum current value criterion zone is a value which is obtained by adding 50% of the value of the current caused to flow through one resistor of the resistor unit 2 to the minimum current value 43 of the non-defective sample. Also, the lower limit value 47 of the minimum current value criterion zone is a value which is obtained by subtracting 50% of a value of a current caused to flow through one resistor of the resistor unit 2 from the minimum current value 43 of the non-defective sample.

For example, reference numeral 48 in the current pattern (FIG. 11C) obtained from the current measure carried out for the DUT designates a maximum current value in all the operation steps. Since the maximum current value 48 exceeds the upper limit value 44 of the maximum current criterion zone, the DUT is judged to be a defective.

Similarly, when the maximum current value in the DUT falls below the lower limit value 45 of the maximum current criterion zone, when the minimum current value in the DUT in all the operation steps exceeds the upper limit value 46 of the minimum current value criterion zone, and when the minimum current value in the DUT falls below the lower limit value 47 of the minimum current value criterion zone, the DUT is judged to be a defective.

As described above, the sorting for a non-defective/a defective is simply carried out for the DUT by utilizing the two criterion zones. This sorting is referred to as "first sorting."

Next, similarly to Embodiment 1, there is carried out "second sorting" for comparing the current pattern of the DUT with the current pattern of the non-defective sample every operation step to carry out the sorting for a non-defective/a defective for the DUT. However, prior to the second sorting, there are carried out optimal setting for the measure range of the current measure circuit 3, and optimal setting for the resistance values of the resistors of the resistor unit 2.

The second sorting, as described in Embodiment 1, corresponds to a method including converting the number of terminals each having the output logic 0 into the current value every operation step of the predetermined operation to carry out the sorting for a non-defective/a defective. Hence, the current measure circuit 3 needs to have the resolution for detecting which a current difference when the total number of terminals of the DUT through which the currents are caused to flow, respectively, differs by even one, and also to have the current measure range in which the maximum current value in all the operation steps can be measured.

Now, if the resistance values of the resistors constituting the resistor unit 2 are set to small values to increase the values of the currents caused to flow through the respective resistors, then a current difference due to a difference in the number of terminals through which the currents are caused to flow, respectively, becomes large accordingly. In this case, however, the maximum current value in all the operation steps also becomes large, and thus it is necessary to widen the current measure range of the current measure circuit 3. When the current measure range is widened, the minimum resolution of the current measure circuit 3 becomes rough. In addition, in a case as well where the number of terminals of the DUT as an object of measure is large, it is necessary to widen the current measure range of the current measure circuit 3.

Figure 12:
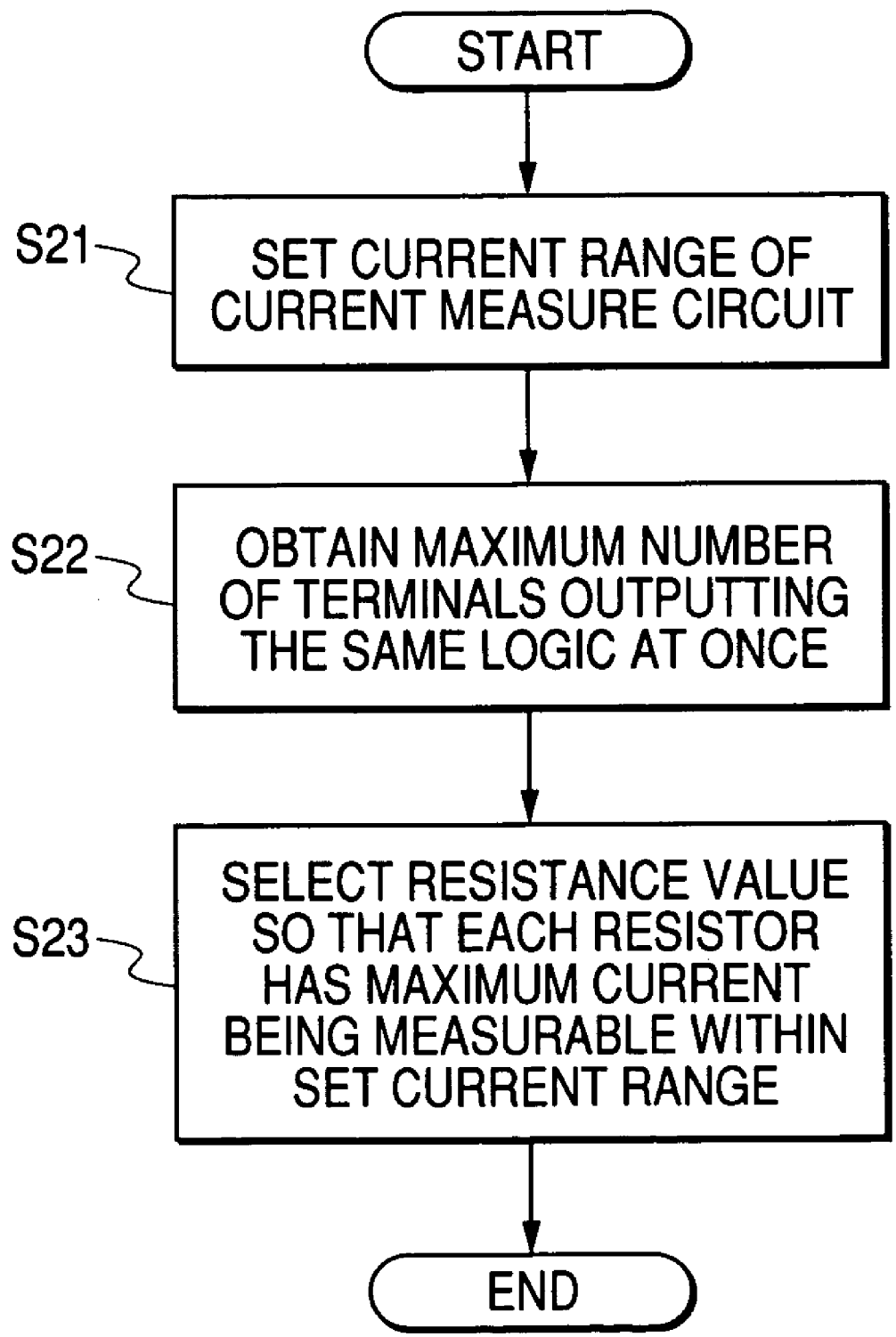
FIG. 12 is a flow chart showing a procedure of a processing for setting an optimal current measure range of a current measure circuit and for selecting optimal resistance values of resistors of a resistor unit.

FIG. 12 is a flow chart showing a procedure of a processing for setting an optimal current measure range of the current measure circuit 3 and for selecting optimal resistance values of the respective resistors of the resistor unit. While this processing is executed by the LSI tester 8 having an information processing function, a part of this processing may be executed by a user of the LSI tester 8.

First of all, in Step S21, the current measure range of the current measure circuit 3 is set based on the maximum current value 42 of the non-defective sample in all the operation steps obtained through the first sorting so that the measure range becomes the lowest under the condition with which the maximum current value 42 can be measured.

Next, in Step S22, the number of terminals when the number of terminals outputting the same output logic 0 at once becomes maximum in all the operation steps in the non-defective sample is obtained based on the maximum current value 42 of the non-defective sample.

In Step S23, a resistor unit having the resistance values allowing the values of the currents caused to flow through the respective resistors constituting the resistor unit 2 to become maximum, each maximum current being measurable within the current measure range set in Step S21, is selected for the resistor unit 2 based on the maximum number of terminals obtained in Step S22.

The second sorting is carried out using the current measure circuit 3 having the current measure range set in such a manner, and the resistor unit 2 in which the resistors have the respective resistance values selected as described above.

As a result, first of all, the first sorting is carried out, whereby for the DUT having the maximum current value or the minimum current value different from that of the non-defective sample, the judgment for a non-defective/a defective can be simply carried out for that DUT, and execution of the second sorting can be omitted to shorten the test time.

In addition, since in the second sorting, the optimization of the current measure range of the current measure circuit 3, and the optimization of the resistance values of the resistors constituting the resistor unit 2 are carried out in advance, the judgment for a non-defective/a defective can be more precisely carried out for the DUT.

Note that, in Embodiment 7, the maximum current value and the minimum current value in the non-defective sample are detected to judge using the maximum current value criterion zone and the minimum current value criterion zone produced from the maximum current value and the minimum current value thus detected whether the DUT is a non-defective or a defective. However, instead of this processing procedure, the maximum current value or the minimum current value in the non-defective sample may be detected to compare the maximum current value or the minimum current value in the DUT with the corresponding criterion zone of the maximum current criterion zone or the minimum current criterion zone using the maximum current criterion zone or the minimum current criterion zone produced from the maximum current value or the minimum current value thus detected, thereby judging whether the DUT is a non-defective or a defective.

Embodiment 8

In a semiconductor integrated circuit testing device according to Embodiment 8 of the present invention, a standard IC (non-defective sample) which has the same function as a test target IC (semiconductor integrated circuit) and which operates normally is disposed so as to pair with the test target IC, and in this state, a test is carried out.

Figure 13:
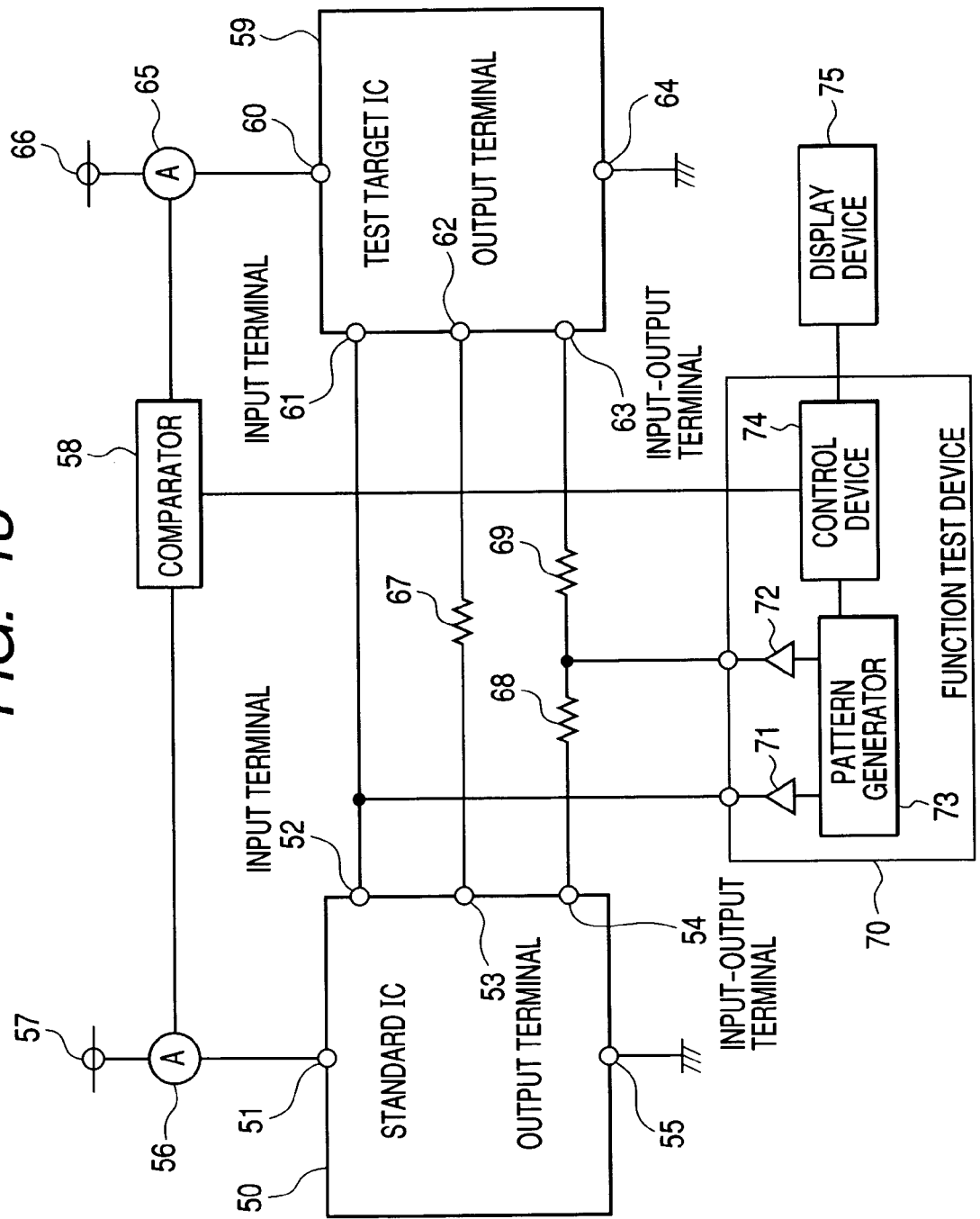
FIG. 13 is a block diagram, partly in circuit diagram, showing a configuration of a semiconductor integrated circuit testing device according to Embodiment 8 of the present invention.

FIG. 13 is a block diagram, partly in circuit diagram, showing a configuration of the semiconductor integrated circuit testing device according to Embodiment 8 of the present invention.

A standard IC 50 is an IC as a standard for a test which has the same function as that of a test target IC 59. The standard IC 50 shows the normal D.C. and A.C. electrical characteristics and functions, and is verified as a non-defective sample in advance. Note that while in actuality, the standard IC 50 has a large number of terminals, a description will be given to an input terminal 52, an output terminal 53, and an input-output terminal 54 as typical ones in FIG. 13. This is also applied to the test target IC 59.

The input terminal 52 of the standard IC 50 is connected to an input terminal 61 of the test target IC 59 and a driver 71 of a function testing device 70, and the output terminal 53 of the standard IC 50 is connected to an output terminal 62 of the test target IC 59 through a resistor 67.

The input-output terminal 54 of the standard IC 50 is connected to an input-output terminal 63 of the test target IC 59 through resistors 68 and 69. A driver 72 of the function testing device 70 is connected to a node between the resistors 68 and 69.

A pattern signal for a function test for the test target IC 59 is input from the pattern generator 73 to the drivers 71 and 72.

Next, power supplies 57 and 66 provided from the function testing device 70 are connected to a power supply terminal 51 of the standard IC 50, and a power supply terminal 60 of the test target IC 59 through ammeters 56 and 65, respectively.

Detected values from the ammeters 56 and 65 are sent to a comparator 58. The comparator 58 compares a difference between absolute values of the two detected values with a predetermined level to send the comparison results to a control device 74.

The control device 74 judges based on the comparison results from the comparator 58 whether the test target IC 59 is a non-defective or a defective to send the judgment results to the display device 75. When the difference between the absolute values of the two detected values exceeds the predetermined level, the test target IC 59 is judged to be a defective.

Next, an operation will hereinafter be described.

Firstly, the pattern signal use to test the test target IC 59 is sent from the pattern generator 73 of the function testing device 70 to the drivers 71 and 72 to be sent from the drivers 71 and 72 to the input terminals 52 and 61, and the input-output terminals 54 and 63 each in the input state, respectively. As a result, the standard IC 50 and the test target IC 59 start to operate to begin to output signals complying with the operation steps (vectors) of the input pattern signal.

The output terminals and the input-output terminals of the standard IC 50 and the test target IC 59 are short-circuited through the resistor 67, and the resistors 68 and 69, respectively. If the test target IC 59 has a defect and hence outputs no normal signal, then the output current will flow from the standard IC 50 to the test target IC 59, or from the test target IC 59 to the standard IC 50 through the resistor 67, or the resistors 68 and 69.

The current value of this output current becomes a value which is obtained by dividing the voltage obtained by subtracting the voltage at the terminal outputting a signal at "a low level" from the voltage at the terminal outputting a signal at "a high level" (normally, such a voltage value corresponds to a value nearly equal to the power supply voltage) by either the resistance value of the resistor 67, or a sum of the resistance values of the resistors 68 and 69.

Since the above-mentioned output current flows in a direction from the standard IC 50 to the test target IC 59, or in a direction opposite thereto, a difference occurs between amount of currents flowing through the power supply terminals 51 and 60 of the two ICs 50 and 59, respectively.

The amount of currents flowing through the power supply terminals 51 and 60 of the two ICs 50 and 59 are measured by the ammeters 56 and 65, respectively, and the comparator 58 compares an absolute value of the difference between the amounts of two currents with a predetermined value. When the comparison results show that the absolute value of the difference between the amounts of two currents is equal to or larger than the predetermined value, a signal is sent from the comparator 58 to the control device 74 to judge that the test target IC 59 is a defective. Then, the judgment results are displayed on the display device 75.

Note that in case of a fault in which the input-output terminal 63 has a high impedance when each of the input-output terminals 54 and 63 is in the output state, since no current flows through the input-output terminal 63, no current flows through the input-output terminal 54 accordingly, and hence no current difference is detected by the comparator 58. Then, the pattern generator 73 causes the driver 72 to output an output signal having logic opposite to the output logic to cause a current to flow through the input-output terminal 54 to thereby allow a current difference to be detected in the comparator 58. As a result, even in the case of the fault in which the input-output terminal 63 has the high impedance, such a fault can be detected.

In addition, when each of the input-output terminals 54 and 63 is in a high impedance state, the pattern generator 73 switches a level of the output signal from the driver 72 over to "a high level" or "a low level" within one operation step (vector) of the pattern signal. When the current difference cannot be detected with any of the high level and the low level in the comparator 58, each of the input-output terminals 54 and 63 is judged to be in the high impedance state.

Similarly, in a case as well where the output terminal 62 of the test target IC 59 has a high impedance (Hi-Z or 3-state) function, the high impedance state is detected by utilizing the same detection method as that in the input-output terminal 63.

Note that while in Embodiment 8 described above, the ammeters 56 and 65 are connected to the sides of the power supply terminals 51 and 60, respectively, the ammeters 56 and 65 may be connected to the sides of the GND terminals 55 and 64, or may be inserted between the power supply terminals 51 and 60, and the GND terminals 55 and 64, respectively, to test the test target IC 59 with high precision.

In addition, the ammeters 56 and 65 may also be replaced with ammeters of a peak value detection type, or ammeters of a type adapted to integrate a current waveform.

Embodiment 9

In Embodiment 9, a pattern generator outputs an expected value of output logic of a test target IC (semiconductor integrated circuit), and the pattern generator is disposed so as to pair with the test target IC. In this state, the test is carried out for the test target IC.

Figure 14:
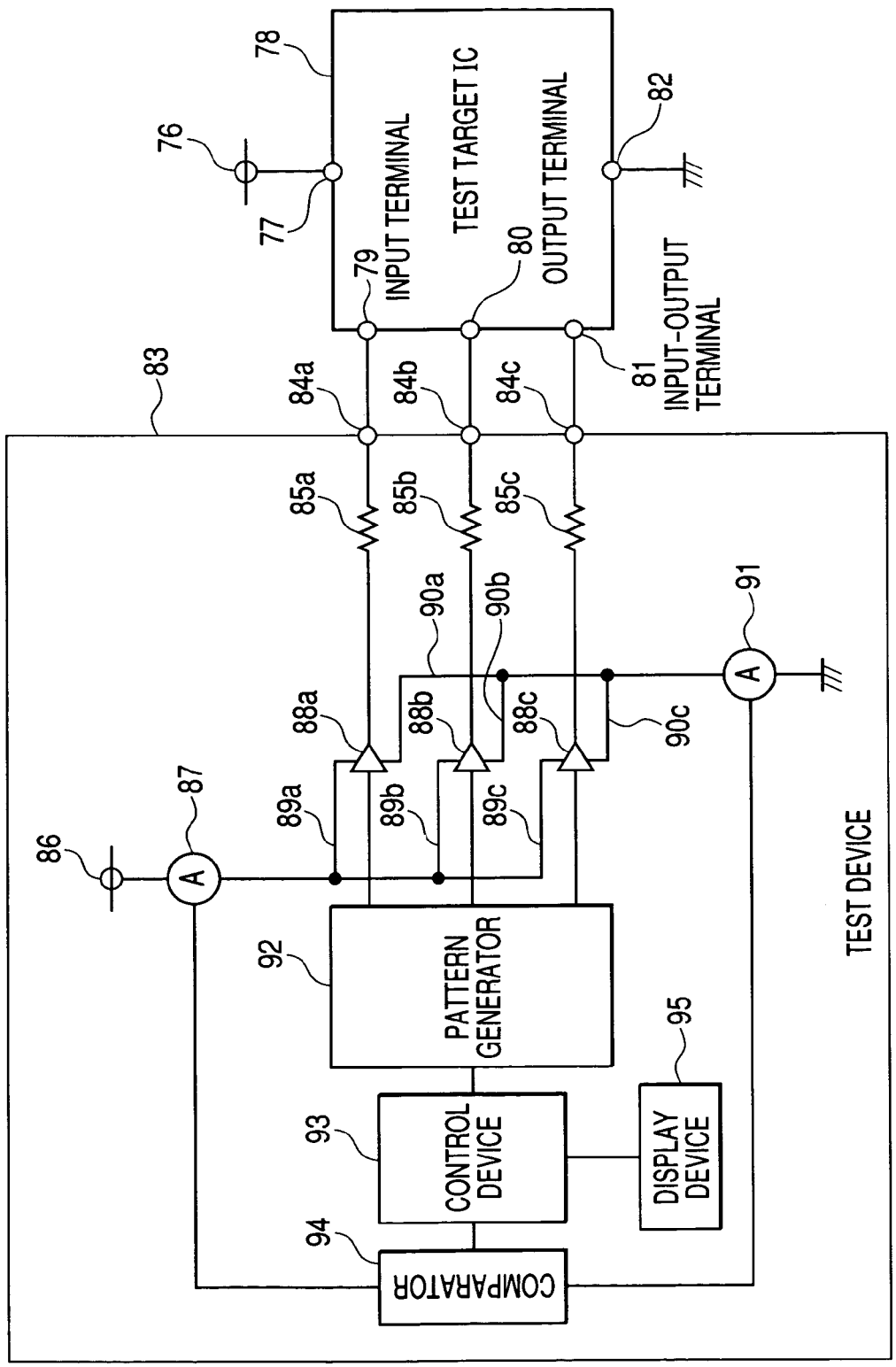
FIG. 14 is a block diagram, partly in circuit diagram, showing a configuration of a semiconductor integrated circuit testing device according to Embodiment 9 of the present invention.

FIG. 14 is a block diagram, partly in circuit diagram, showing a configuration of a semiconductor integrated circuit testing device according to Embodiment 9 of the present invention.

A power supply terminal 77 of a test target IC 78 is connected to a power supply 76 provided from a testing device 83, and a GND terminal 82 of the test target IC 78 is connected to GND. An input terminal 79, an output terminal 80, and an input-output terminal 81 of the test target IC 78 are connected to output terminals 84a, 84b, and 84c of the testing device 83, respectively.

The output terminals 84a, 84b, and 84c are connected to drivers 88a, 88b, and 88c through resistors 85a, 85b, and 85c, respectively. Power supply terminals 89a, 89b, and 89c of the drivers 88a, 88b, and 88c are collectively connected to a power supply 86 through an ammeter 87. A voltage of the power supply 86 is set to the same voltage as that of the power supply 76 of the test target IC 78.

GND terminals 90a, 90b, and 90c of the drivers 88a, 88b and 88c are collectively connected to GND through an ammeter 91.

A pattern signal for a function test for the test target IC 78 is input from the pattern generator 92 to the drivers 88a, 88b, and 88c. The pattern signal contains input logic for the function test, and an expected value of output logic on that occasion.

The pattern generator 92 is controlled by a control device 93. Detected values from the ammeters 87 and 91 are sent to a comparator 94. The comparator 94 compares at least one of the two detected values with a predetermined level to send the comparison results to the control device 93.

The control device 93 judges based on the comparison results from the comparator 94 whether the test target IC 78 is a non-defective or a defective to send the judgment results to a display device 95. When at least one of the two detected values exceeds the predetermined level, the test target IC 78 is judged to be a defective.

Next, an operation will hereinafter be described.

Firstly, the pattern generator 92 of the testing device 83 outputs the pattern signal for a test for the test target IC 78 to the input terminal 79 and the input-output terminal 81 of the test target IC 78 through the drivers 88a and 88c, respectively. In response to this pattern signal, the test target IC 59 starts to operate and output an output signal complying with the input pattern signal.

The output terminal 80 and the input-output terminal 81 of the test target IC 78 are short-circuited with drivers 88b and 88c of the testing device 83 through resistors 85b and 85c, respectively. Hence, if the test target IC 78 has a fault and thus outputs no normal signal, then currents flow from the drivers 88b and 88c of the testing device 83 to the test target IC 78, or from the test target IC 78 to the drivers 88b and 88c of the testing device 83 through the resistors 85b and 85c, respectively.

When the test target IC 78 is a non-defective, an output signal of the driver 88b and an output signal through the output terminal 80 of the test target IC 78, or an output signal of the driver 88c and an output signal through the input-output terminal 81 of the test target IC 78 agree in level with each other. As a result, currents other than instantaneous through currents flowing when the drivers 88a, 88b, and 88c carry out the switching operation are hardly caused to flow through the ammeters 87 and 91, respectively.

However, when the test target IC 78 is a defective, the drivers 88b and 88c source or sink the currents. Hence, a large current is caused to flow through one of the ammeters 87 and 91, or both the ammeters 87 and 91.

The comparator 94 compares each of the two current values detected by the ammeters 87 and 91 with a predetermined value (corresponding to a current value which is obtained by dividing the power supply voltage by the resistance value of the resistor 85b or 85c) to send the comparison results to the control device 93. When the comparison results show that each of the two current values is equal to or larger than the predetermined value, the control device 93 judges that the test target IC 78 is a defective to cause the display device 95 to display thereon the judgment results.

Note that when the input-output terminal 81 of the test target IC 78 is suspected of being in a high impedance state, the pattern generator 92 switches a level of a pattern signal of the driver 88c over to "a high level" or "a low level" within one operation step (one vector) of the pattern signal. If the currents are not caused to flow through the ammeters 87 and 91 even at any of those levels, it is possible to verify that the input-output terminal 81 of the test target IC 78 is in the high impedance state.

Similarly, in a case as well where the output terminal 80 of the test target IC 78 has a high impedance (Hi-Z or 3-state) function, the high impedance state of the output terminal 80 can be verified by utilizing the same method as that including the level switching for the input-output terminal 81.

Note that while the resistor 85a is inserted so that the same circuit configuration is obtained for the output terminals 84a, 84b, and 84c, the resistors 85a may be omitted if especially not required.

In addition, in Embodiment 9, the power supply terminals 89a, 89b, and 89c, and the GND terminals 90a, 90b, and 90c of the drivers 88a, 88b, and 88c are collectively connected to the ammeters 87 and 91, respectively. However, instead of this connection form, ammeters may be prepared for the drivers 88a, 88b, and 88c, respectively, or it may be selected whether or not the ammeters 87 and 91 are connected to each of the drivers 88a, 88b, and 88c. As a result, the characteristics for each terminal of the test target IC 78 can be detected with higher precision.

In addition, in Embodiment 9, the resistor 85b is inserted between the driver 88b and the output terminal 80. However, the resistor 85b may be replaced with any other component such as a capacitor, or a suitable circuit. Also, the ammeters 87 and 91 may also be replaced with ammeters of a peak value detection type, or ammeters of a type adapted to integrate a current waveform.

Embodiment 10

Embodiment 10 is directed to a developed method of testing the input-output terminals of the semiconductor integrated circuit testing device of Embodiment 9.

Figure 15:
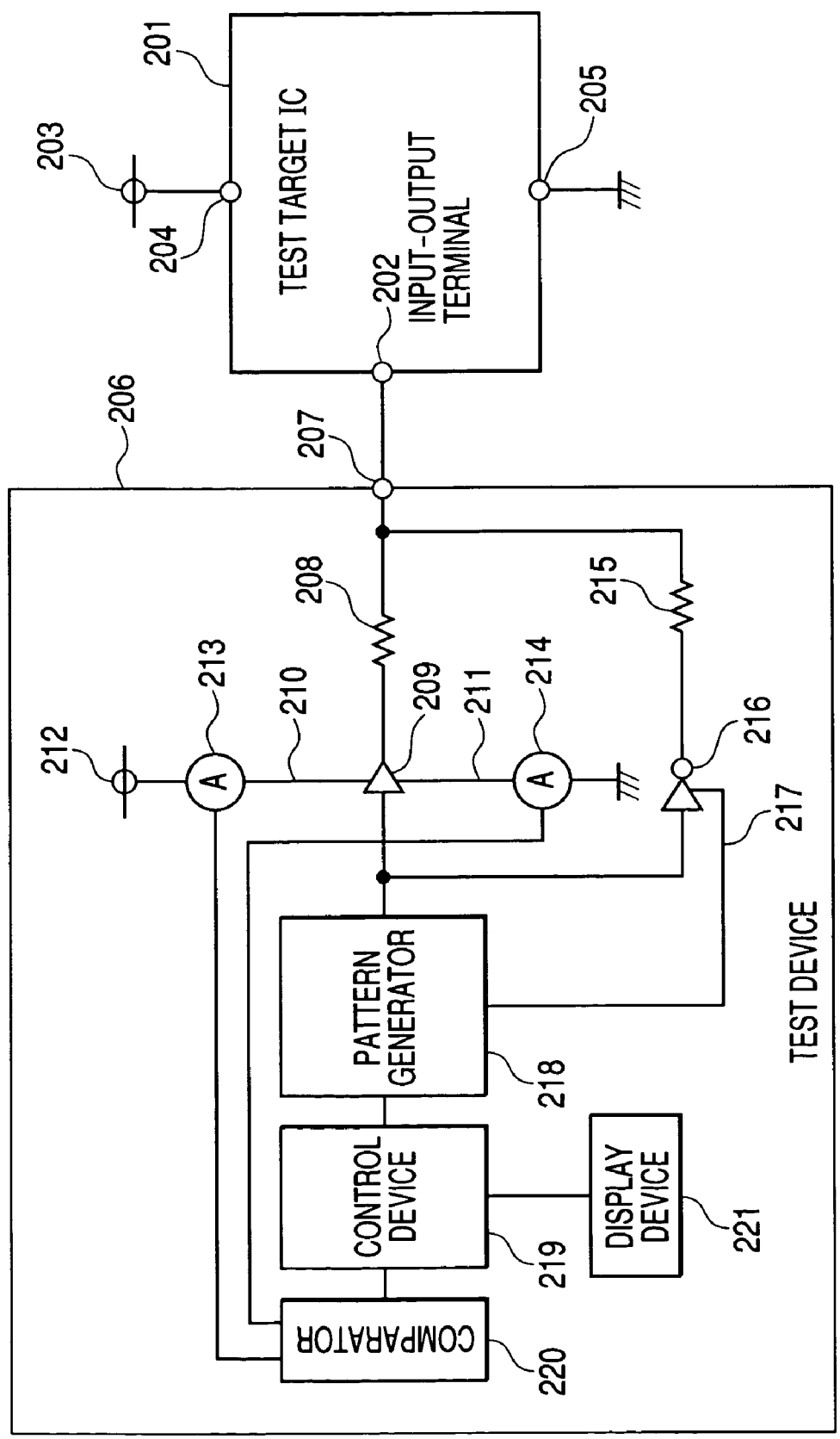
FIG. 15 is a block diagram, partly in circuit diagram, showing a configuration of a testing device for input-output terminals of a semiconductor integrated circuit in Embodiment 10 of the present invention.

FIG. 15 is a block diagram, partly in circuit diagram, showing a configuration of a testing device for input-output terminals of a semiconductor integrated circuit according to Embodiment 10 of the present invention.

A power supply terminal 204 of a test target IC 201 is connected to a power supply 203, and a GND terminal 205 of the test target IC 201 is connected to GND. An input-output terminal 202 of the test target IC 201 is connected to an output terminal 207 of the testing device 206.

An output terminal 207 is connected to a driver 209 through a resistor 208, and the driver 209 is connected to a pattern generator 218. The pattern generator 218 outputs a pattern signal for a function test for the test target IC 201 to the driver 209. The pattern signal contains an input pattern for the function test for the test target IC 201, and an expected value which will be output when the test target IC 201 is judged to be normal in correspondence to the input pattern.

A power supply terminal 210 of the driver 209 is connected to a power supply 212 through an ammeter 213. A power supply voltage of the power supply 212 is set to the same voltage as that of the power supply 203 of the test target IC 201. A GND terminal 211 of the driver 209 is connected to GND through an ammeter 214.

In addition, the output terminal 207 is also connected to a resistor 215 which is in turn connected to a driver 216 for a high impedance test. The driver 216 for a high impedance test is connected to a pattern generator 218 and outputs a logic signal (an output signal of negative logic) which is obtained by inverting a logic signal output from the driver 209 connected to the pattern generator 218.

Note that an output enable terminal 217 is provided in the driver 216 for a high impedance test, and an enable signal and a disable signal are input from the pattern generator 218 to the output enable terminal 217 in correspondence to the pattern signal. The driver 216 for a high impedance test becomes an output state when the enable signal is input and becomes a high impedance state, i.e., a state of not outputting an output signal when the disable signal is input.

The pattern generator 218 is controlled by a control device 219.

Detected values from the ammeters 213 and 214 are sent to the comparator 220. The comparator 220 compares at least one of the two detected values with a predetermined value to send the comparison results to the control device 219. When the comparison results show that at least one of the two detected values exceeds the predetermined value, the control device 219 judges that the test target IC 201 is a defective to send the judgment results to the display device 221 to cause the display device 221 to display thereon the judgment results.

Note that while in FIG. 15, only one input-output terminal 202 is illustrated in the test target IC 201, in actuality, a plurality of input-output terminals exist in the test target IC 201, and a plurality of drivers and drivers for a high impedance test exist therein in correspondence to the input-output terminals. A plurality of drivers, as in Embodiment 9 shown in FIG. 14, are collectively connected to the ammeters 231 and 214.

Next, an operation will hereinafter be described.

When the input-output terminals 202 of the test target IC 201 are suspected of being in an input state or in a high impedance state, the pattern generator 218 outputs the disable signal to the output enable terminal 217 of the driver 216 for a high impedance test to set the output of the driver 216 for a high impedance test to a high impedance state.

When the input-output terminal 202 of the test target IC is in the input state, the pattern generator 218 outputs the pattern signal to the test target IC 201 through the driver 209. In addition, when the input-output terminal 202 of the test target IC 201 is suspected of being in a high impedance state, the level of the output signal of the driver 209 is switched over to "a high level" or "a low level." In this state, the high impedance state is verified with no current being caused to flow through the ammeters 213 and 214 at any of those levels.

The above-mentioned operation is the same as that in the case of Embodiment 9.

Next, when the input state of the input-output terminal 202 of the test target IC 201 is changed over to the output state, the pattern generator 218 outputs the enable signal to the output enable terminal 217 of the driver 216 for a high impedance test to set the state of the driver 216 for a high impedance test in the output state. The driver 216 for a high impedance test set in the output state inverts the pattern signal sent from the pattern generator 218 to output the inverted pattern signal, which means that the driver 216 for a high impedance test outputs the signal of negative logic (inverted output signal) for the output logic of the output signal of the driver 209.

Assuming that the output signal through the input-output terminal 202 of the test target IC 201 is at "a high level" and the expected value is also at "a high level," the output signal of the driver 209 is also at "a high level." As a result, no current is caused to flow through the resistor 208. At this time, however, the driver 216 for a high impedance test outputs the output signal at "a low level," so as to cause an electric potential difference to occur between the input-output terminal 202 and the driver 216 for a high impedance test, and hence a current is caused to flow from the input-output terminal 202 into the side of the driver 216 for a high impedance test through the resistor 215. Here, despite that the driver 209 also outputs the output signal at "a high level," a current is hardly caused to flow from the driver 209 to the side of the driver 216 for a high impedance test due to the resistor 208 being interposed between the driver 209 and the driver 216 for a high impedance test. Thus, the current is hardly caused to flow through the driver 209, thereby judging that the test target IC 201 is non-defective.

Next, a description will hereinafter be given with respect to a fault in which the input-output terminal 202 becomes a high impedance state, whereas the expected value of the input-output terminal 202 of the test target IC 201 is at "a high level."

In the case where the pattern generator 218 outputs the disable signal to the output enable terminal 217 of the driver 216 for a high impedance test, and hence the output of the driver 216 for a high impedance test is the high impedance state, the expected value of the input-output terminal 202 of the test target IC 201 is at "a high level," i.e., the output of the driver 209 is at "a high level" and at this time, assuming that the input-output terminal 202 is in the high impedance state, no current is caused to flow through the resistor 208, and hence the fault in which the input-output terminal 202 becomes the high impedance state cannot be detected. In other words, it is understood that in such a testing device of Embodiment 9 as to include no driver 216 for a high impedance test, the fault in which the input-output terminal 202 becomes the high impedance state cannot be detected.

In Embodiment 10, in such a case, the pattern generator 218 outputs the enable signal to the output enable terminal 217 of the driver 216 for a high impedance test to set the output enable terminal 217 in the output state. Thus, the driver 216 for a high impedance test outputs the output signal at "a low level" due to the output signal of the driver 209 being at "a high level." At this time, as long as the input-output terminal 202 has become the high impedance state, a current is caused to flow from the driver 209 at "a high level" into the driver 216 for a high impedance test through the resistors 208 and 215. This current is detected by the ammeter 213, thereby judging that the test target IC 201 is defective, and hence the fault in which the input-output terminal 202 becomes the high impedance state may be detected.

Note that the predetermined value as the comparison reference used in the comparator 220 in Embodiment 10, unlike the case of Embodiment 9, is a value which is obtained by dividing the power supply voltage of the power supply 212 by a sum of the resistance values of the resistors 208 and 215.

Above, the description has been given with respect to the fault in which the input-output terminal 202 is in the high impedance state with the expected value of the input-output terminal 202 of the test target IC 201 being at "a high level." However, in the case of a fault in which the input-output terminal 202 is in the high impedance state with the expected value of the input-output terminal 202 of the test target IC 201 being at "a low level," the driver 216 for a high impedance test outputs the output signal at "a high level," thereby causing a current to flow from the driver 216 for a high impedance test into the driver 209 through the resistors 215 and 208, and this current is detected by the current 214. Consequently, in this case as well, the test target IC 201 is judged to be a defective, and hence the fault in which the input-output terminal 202 becomes the high impedance state may be detected.

In general, the function test of the semiconductor integrated circuit is carried out after completion of the test for the D.C. electrical characteristics. Hence, for an LSI having no input-output terminal, or an LSI having no high impedance function in any of output terminals, a fault, such as an open fault, for a high impedance state is detected through the test for the D.C. electrical characteristics. However, it is also assumed in an LSI in which an input-output terminal becomes a high impedance state through the control for internal logic that the input-output terminal becomes the high impedance state due to a logical fault of the internal logic, the testing device as in Embodiment 10 is effective for a test for an LSI having such a fault.

Embodiment 11

Figure 16:
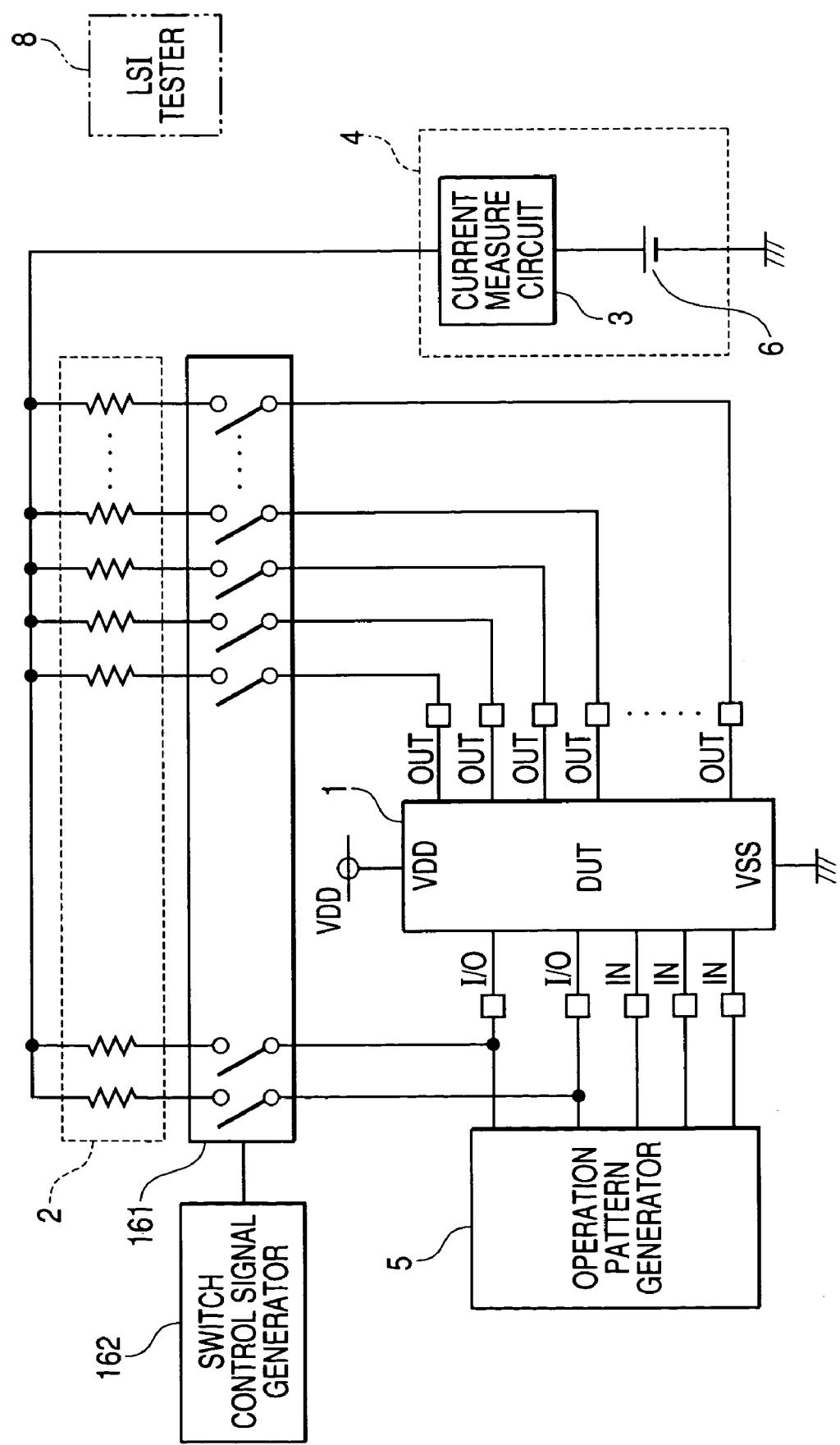
FIG. 16 is a block diagram, partly in circuit diagram, showing a configuration of a semiconductor integrated circuit testing device according to Embodiment 11 of the present invention.

FIG. 16 is a block diagram, partly in circuit diagram, showing a configuration of a semiconductor integrated circuit testing device according to Embodiment 11 of the present invention. A configuration of Embodiment 11 is basically the same as that of Embodiment 1, so the same constituent elements as those in Embodiment 1 are designated with the same reference numerals, and their description are omitted here for the sake of simplicity.

One terminals of a plurality of resistors constituting a resistor unit 2 are short-circuited to be connected to a voltage application circuit 4, and the other terminals thereof are connected to one terminals of a plurality of switches constituting a switch unit 161, respectively. Each of the other terminals of a plurality of switches constituting the switch unit 161 is connected to one of the output terminals and one of the input-output terminals of a DUT 1, respectively. A switch control signal generator 162 is connected to the switch unit 161. Thus, each of the switches constituting the switch unit 161 is turned ON/OFF in accordance with a control signal generated from the switch control signal generator 162.

On the other hand, a non-defective sample is connected instead of the DUT 1 to the semiconductor integrated circuit testing device, and a total sum of currents which are caused to flow through each of the resistors of the resistor unit 2 at every operation step of a predetermined operation pattern, respectively, is measured in advance by a current measure circuit 3 in the configuration shown in FIG. 16, and the measure results are stored in an LSI tester 8. Then, the LSI tester 8 compares the measure results which are obtained using the DUT 1 with the measure results which are obtained in advance using the non-defective sample at every operation step.

Figure 17:
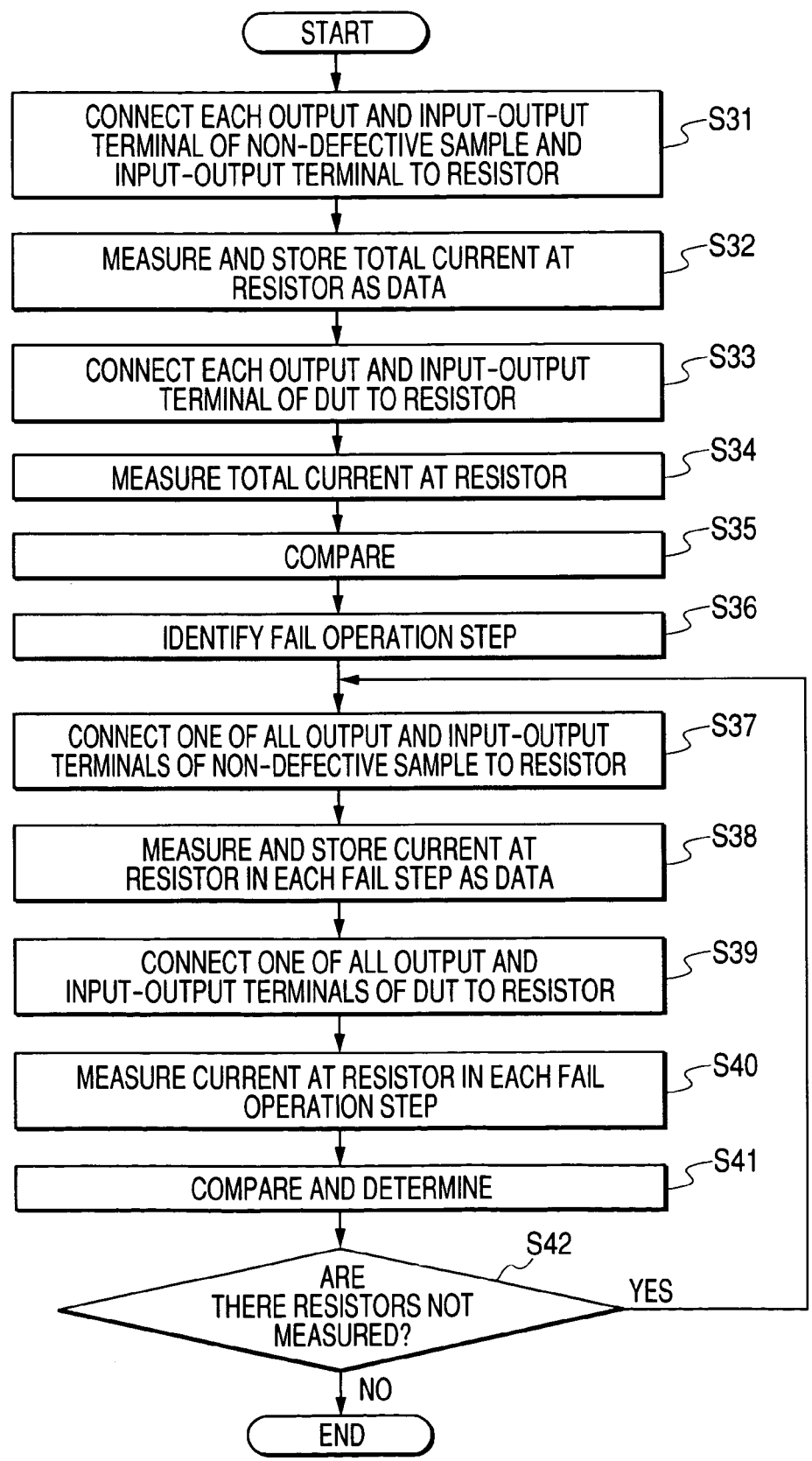
FIG. 17 is a flow chart showing a procedure of a test processing for a DUT executed in an LSI tester in Embodiment 11 of the present invention.

FIG. 17 is a flow chart showing a procedure of a test processing for the DUT 1 which is executed in the LSI tester 8 in Embodiment 11.

First of all, the non-defective sample is connected instead of the DUT 1 to the semiconductor integrated circuit testing device shown in FIG. 16. Then, the switch control signal generator 162 generates the control signal to turn ON all the switches constituting the switch unit 2, thereby connecting all the output terminals and the input-output terminals of the non-defective sample to the resistors of the resistor unit 2, respectively (Step S31).

Thereafter, the operation pattern generator 5 inputs a pattern signal of an operation pattern having a plurality of operation steps to the input terminals and the input-output terminals of the DUT 1. Then, in a stationary state of the non-defective sample, the current measure circuit 3 measures a total sum of values of the currents caused to flow through the resistors of the resistor unit 2, respectively, at every operation step to preserve the resultant measure results as reference data in the LSI tester 8 (Step S32).

Next, the DUT 1 is connected instead of the non-defective sample to the semiconductor integrated circuit testing device shown in FIG. 16. Then, the switch control signal generator 162 generates the control signal to turn ON all the switches constituting the switch unit 2, thereby connecting all the output terminals and the input-output terminals of the non-defective sample to the resistors of the resistor unit 2, respectively (Step S33).

Thereafter, the operation pattern generator 5 inputs the pattern signal of the predetermined operation pattern (having a plurality of operation steps) to the input terminals and the input-output terminals of the DUT 1. Then, in the stationary state of the DUT 1, the current measure circuit 3 measures a total sum of values of the currents caused to flow through the resistors of the resistor unit 2, respectively, at every operation step (to preserve the resultant measure results as reference data in the LSI tester 8) (Step S34).

The LSI tester 8 compares the current value obtained in Step S34 with the reference data stored in Step S32 at every operation step (Step S35). This comparison, as described above, is carried out in accordance with the timing chart shown in FIG. 2.

Here, when the DUT 1 outputs a logic value different from that of the non-defective sample, the operation steps (fail operation steps) in each of which the different logic value is output are specified (Step S36).

Next, the non-defective sample is connected instead of the DUT 1 to the semiconductor integrated circuit device. Then, the switch control signal generator 162 generates the control signal to turn ON any one of all the switches constituting the switch unit 161, thereby connecting the output terminal or the input-output terminal of the non-defective sample corresponding to one of the switches to the corresponding resistor of the resistor unit 2 (Step S37).

Then, the current caused to flow through the corresponding resistor of the resistor unit 2 is measured by the current measure circuit 3 using each of the fail operation steps specified in Step S36 (Step S38).

Next, the DUT 1 is connected instead of the non-defective sample to the semiconductor integrated circuit device. Then, the switch control signal generator 162 generates the control signal to turn ON again the switches turned ON in Step S37 of all the switches constituting the switch unit 161, thereby connecting the output terminal or the input-output terminal of the DUT 1 corresponding to the switches to the corresponding resistor of the resistor unit 2 (Step S39).

Then, the current caused to flow through the corresponding resistor of the resistor unit 2 is measured by the current measure circuit 3 in each of the fail operation steps specified in Step S36 (Step S40).

The current value in each of the fail operation steps measured in Step S40 is compared with the current value in each of the fail operation steps stored in Step S38 at every fail operation step. When both the current values agree with each other, the one output terminal or input-output terminal of the DUT 1 connected to the one resistor of the resistor unit 2 is judged to be normal. On the other hand, when both the current values are different from each other, the one output terminals or input-output terminals of the DUT 1 connected to the one of the resistors of the resistor unit 2 is judged to be abnormal (Step S41).

Next, it is determined whether or not there remains the switch which has not yet been selected by the switch control signal generator 162 and hence has not been turned ON, and there remains the resistor for which the individual measure for the amount of current has not yet been carried out (Step S42). When it is determined in Step S42 that the resistor for which the individual measure for the amount of current has not yet been carried out exists in the resistor unit 2, the operation proceeds to Step S37, and the processing from Steps S37 to S42 is executed for the unmeasured resistor. On the other hand, when it is determined in Step S42 that the individual measure for the amount of current is carried out for all the resistors constituting the resistor unit 2, this test processing is completed.

As described above, according to Embodiment 11, the abnormal terminals of the DUT 1 can be readily specified without carrying out the logic simulation and the failure simulation.

Note that in the semiconductor integrated circuit testing device shown in FIG. 16, there may also be adopted a configuration in which the resistor unit 2 and the switch unit 161 are replaced with each other, one terminals of each of the switches constituting the switch unit 161 are connected to the voltage application unit 4, one terminals of the resistors constituting the resistor unit 2 are connected to the DUT 1, and the other terminals of the switches are connected to the other terminals of the resistors, respectively.

Embodiment 12

Figure 18:
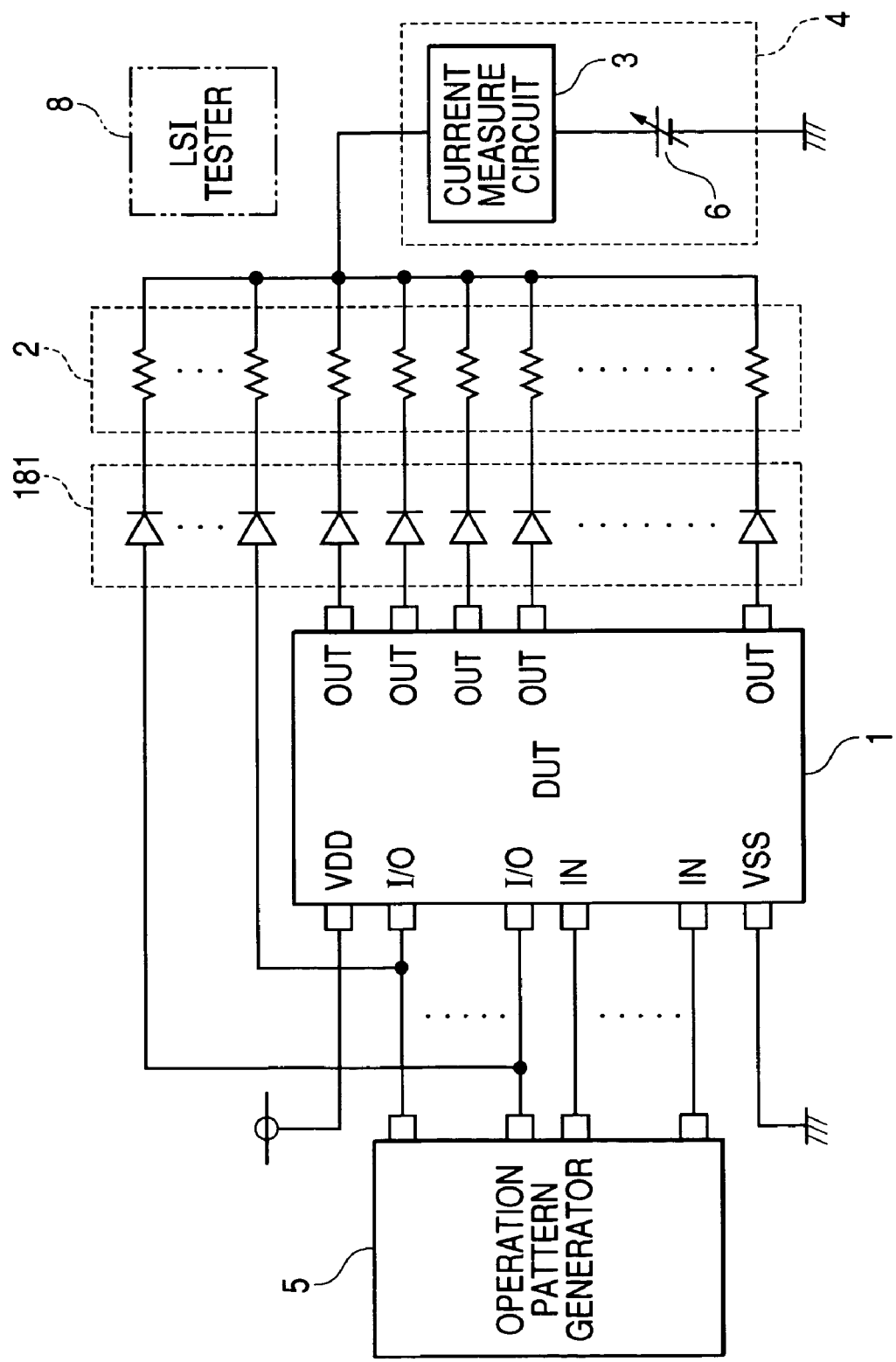
FIG. 18 is a block diagram, partly in circuit diagram, showing a configuration of a semiconductor integrated circuit testing device according to Embodiment 12 of the present invention.

FIG. 18 is a block diagram, partly in circuit diagram, showing a configuration of a semiconductor integrated circuit testing device according to Embodiment 12 of the present invention. A configuration of Embodiment 13 is basically the same as that of Embodiment 12, in FIG. 19, so the same constituent elements as those of Embodiment 12 shown in FIG. 18 are designated with the same reference numerals, and their descriptions are omitted here for the sake of simplicity, and only different constituent elements will hereinafter be described.

In Embodiment 12, a diode unit 181 is further connected to the semiconductor integrated circuit testing device. Note that in FIG. 18, the switch control unit 161 and the switch control signal generator 162 are not shown. In Embodiment 12, the semiconductor integrated circuit testing device may be provided with the switch control unit 161 and the switch control signal generator 162, or may not be provided with the switch control unit 161 and the switch control signal generator 162. Hereinafter, a description will be given by giving a case where the semiconductor integrated circuit testing device is provided with neither of the switch control unit 161 and the switch control signal generator 162 as an example.

The diode unit 181 is constituted by a plurality of diodes of the same number as that of resistors of the resistor unit 2. A cathode side of each of the diodes is connected to each of the resistors of the resistor unit 2, respectively, and an anode side of each of the diodes is connected to one of the output terminals (OUT) and one of the input-output terminals (I/O) of the DUT 1, respectively.

First of all, a problem in a case where no diode unit 181 is provided in the semiconductor integrated circuit testing device will hereinafter be described.

That is, when an output voltage of a voltage application circuit 4 is set equal to a terminal voltage when an L signal (low level signal) is output to each of the output terminals (OUT) or the input-output terminals (I/O) of the DUT 1, currents are caused to flow toward the voltage application circuit 4 into each of the resistors of the resistor unit 2 connected to the output terminals or the input-output terminals of the DUT 1 an H signal (high level signal) is output while the currents are not caused to flow into each of the resistors of the resistor unit 2 connected to the output terminals or the input-output terminals to which the L signal (low level signal)is output. It can be said that in order to measure a total sum of values of the currents caused to flow through each of the resistors of the resistor unit 2 connected to the output terminals or the input-output terminals of the DUT 1 to which the L signal is output, such setting of the output voltage of the voltage application circuit 4 is ideal as described above.

When a large number of output terminals and input-output terminals exist in the DUT 1 in this ideal setting, as the number of terminals of the DUT 1 to which the L signal becomes large, it cannot be said that a composite resistance value of the resistances of each of the resistors of the resistor unit 2 connected to each of the terminals of the DUT 1 to which the H signal is output is much larger than an internal resistance of the current measure circuit 3. For this reason, it is conceivable that a part of the current flows from each of the terminals of DUT 1 to which the H signal is output flows into each of the terminals of the DUT 1 to which the L signal is output, but not into the current measure current 3. Thus, an error occurs in a current measured value obtained in the circuit measure circuit 3 which is to measure a total sum of values of the currents flowing from each of the terminals of the DUT 1 to which the H signal is output, and hence it becomes impossible to precisely judge whether the DUT 1 is a non-defective or a defective.

On the other hand, in the semiconductor integrated circuit testing device of Embodiment 12 provided with the diode unit 181, the diodes of the diode unit 181 are connected to all the input terminals and the input-output terminals of the DUT 1 in the direction along which the currents are caused to flow from the DUT 1 to each of the resistors of the resistor unit 2. Hence, the currents flowing out through each of the terminals of the DUT 1 to which H signal is output are prevented from flowing into each of the terminals of the DUT 1 to which L signal is output. As a result, all the currents flowing out through each of the terminals of the DUT 1 to which L signal is output flow into the current measure circuit 3.

Consequently, a total sum of the currents flowing from each of the terminals of the DUT 1 to which the L signal is output is precisely measured by the current measure circuit 3, which results in that it is possible to precisely judge whether the DUT 1 is a non-defective or a defective.

In addition, when the semiconductor integrated circuit testing device is provided with no diode unit 181, a terminal voltage at each of the terminals of the DUT 1 to which L signal is output disperses at every DUT or terminal. Thus, the current slightly flows into each of the terminals of the DUT 1 to which L signal is output through the resistor corresponding to any one of the terminals of the DUT 1 to which L signal is output. As a result, an error occurs in the current measured value obtained in the current measure circuit 3 which is to measure a total sum of currents flowing from each of the terminals of the DUT 1 to which H signal is output, which results in that it is impossible to precisely judge whether the DUT 1 is a non-defective or a defective.

On the other hand, in the semiconductor integrated circuit testing device of Embodiment 12 which is provided with the diode unit 181, no current flows into each of the terminals of the DUT 1 to which L signal is output due to the provision of the diode unit 181. Thus, a total sum of currents flowing from each of the terminals of the DUT 1 to which L signal is output is precisely measured by the current measure unit 3. Consequently, the output voltage of the voltage application circuit 4 has only to meet the following condition.

The output voltage of the voltage application circuit 4<(the terminal voltage of each of the terminals of the DUT 1 to which H signal is output–the forward-bias voltage of each of the diodes of the diode unit 181)

Thus, whether the DUT 1 is a non-defective or a defective can be precisely judged without suffering an influence of the fluctuation in the terminal voltages at each of the terminals of the DUT 1 to which L signal is output.

Embodiment 13

Figure 19:
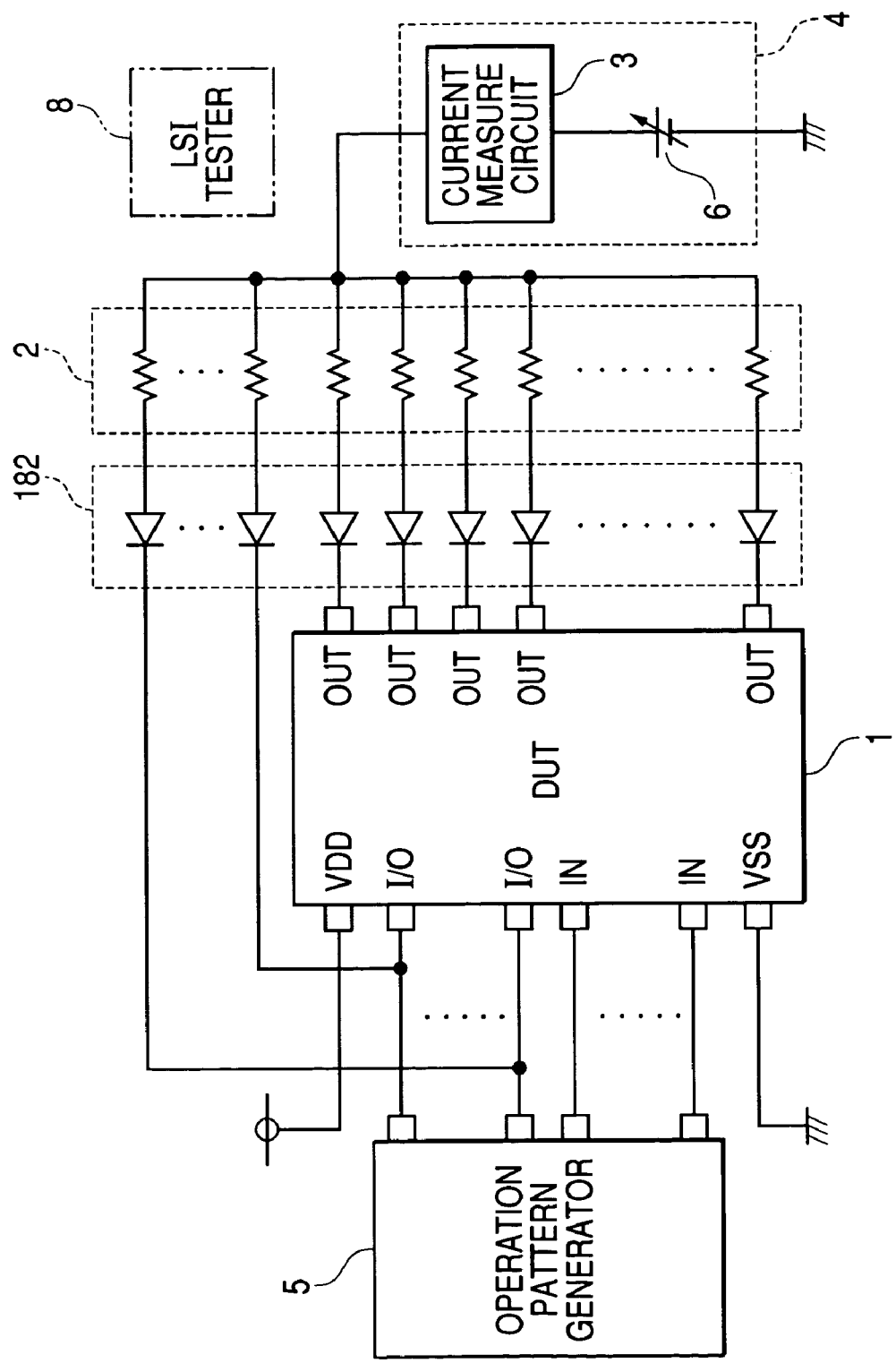
FIG. 19 is a block diagram, partly in circuit diagram, showing a configuration of a semiconductor integrated circuit testing device according to Embodiment 13 of the present invention.

FIG. 19 is a block diagram, partly in circuit diagram, showing a configuration of a semiconductor integrated circuit testing device according to Embodiment 13 of the present invention. A configuration of Embodiment 13 is basically the same as that of Embodiment 12, in FIG. 19, so the same constituent elements as those of Embodiment 12 shown in FIG. 18 are designated with the same reference numerals, and their descriptions are omitted here for the sake of simplicity, and only different constituent elements will hereinafter be described.

In Embodiment 13, the diode unit 181 of Embodiment 12 shown in FIG. 18 is replaced with a diode unit 11 having the reverse current flowing direction. Note that in Embodiment 13 as well, the semiconductor integrated circuit testing device may be provided with the switch control unit 161 and the switch control signal generator 162, or may not be provided with the switch control unit 161 and the switch control signal generator 162. Hereinafter, a description will be given by giving a case where the semiconductor integrated circuit testing device is provided with neither of the switch control unit 161 and the switch control signal generator 162 as an example.

The diode unit 182 is constituted by a plurality of diodes of the same number as that of resistors of the resistor unit 2. An anode side of each of the diodes is connected to each of the resistors of the resistor unit 2, respectively, and a cathode side of each of the diodes is connected to each of the output terminals (OUT) and input-output terminals (I/O) of the DUT 1, respectively.

In Embodiment 13 as well, first of all, a problem in a case where no diode unit 182 is provided in the semiconductor integrated circuit testing device will hereinafter be described.

That is, when an output voltage of a voltage application circuit 4 is set equal to a terminal voltage when an H signal (high level signal) is output to each of the output terminals (OUT) or the input-output terminals (I/O) of the DUT 1, currents are caused to flow from the voltage application circuit 4 into each of the resistors of the resistor unit 2 connected to the output terminals or the input-output terminals of the DUT 1 to which an L signal (low level signal) is being output. However, no currents are caused to flow through each of the resistors of the resistor unit 2 connected to each of the output terminals or the input-output terminals of the DUT 1 to which the H signal is being output. It can be said that in order to measure a total sum of values of the currents caused to flow through each of the resistors of the resistor unit 2 connected to the output terminals or the input-output terminals of the DUT 1 to which the L signal is output, such setting of the output voltage of the voltage application circuit 4 is ideal as described above.

When a large number of output terminals and input-output terminals exist in the DUT 1 in this ideal setting, as the number of terminals of the DUT 1 to which the H signal is output becomes large, it cannot be said that a composite resistance value of each of the resistances of the resistors of the resistor unit 2 connected to each of the terminals of the DUT 1 to which the H signal is output is much larger than an internal resistance of the current measure circuit 3. For this reason, it is conceivable that the current flows not only into the terminals of the DUT 1 to which the L signal is output from the voltage application circuit 4 to each of the terminals of the DUT 1 to which the L signal is output, but also from each of the terminals of the DUT 1 to which the H signal is output. Thus, an error occurs in a current measured value obtained in the circuit measure circuit 3 which is to measure a total sum of values of the currents flowing from the voltage application circuit 4 to each of the terminals of the DUT 1 to which the L signal is output, and hence it becomes impossible to precisely judge whether the DUT 1 is a non-defective or a defective.

On the other hand, in the semiconductor integrated circuit testing device of Embodiment 13 provided with the diode unit 182, the diodes of the diode unit 182 are connected to all the input terminals and the input-output terminals of the DUT 1 in the direction along which the currents are caused to flow from each of the resistors of the resistor unit 2 to the DUT 1, respectively. Hence, the currents are prevented from flowing from each of the terminals of the DUT 1 to which the H signal is output into each of the terminals of the DUT 1 to which the L signal is output. As a result, the value of the current measured by the current measure circuit 3 corresponds to only a total sum of currents flowing from the voltage application circuit 4 to each of the terminals of the DUT 1 to which the L signal is output.

Consequently, a total sum of currents flowing from the voltage application circuit 4 to each of the terminals of the DUT 1 to which the L signal is output is precisely measured by the current measure circuit 3, which results in that it is possible to precisely judge whether the DUT 1 is a non-defective or a defective.

In addition, when the semiconductor integrated circuit testing device is provided with no diode unit 182, a terminal voltage at each of the terminals of the DUT 1 to which the H signal is output disperses at every DUT or terminal. Thus, the current slightly flows into each of the terminals of the DUT 1 to which the H signal is output through the resistor corresponding to any one of the terminals of the DUT 1 to which the H signal is output. As a result, an error occurs in the current measured value obtained in the current measure circuit 3 which is to measure a total sum of currents flowing from the voltage application circuit 4 to each of the terminals of the DUT 1 to which the L signal is output, which results in that it is impossible to precisely judge whether the DUT 1 is a non-defective or a defective.

On the other hand, in the semiconductor integrated circuit testing device of Embodiment 13 which is provided with the diode unit 182, no current flows from each of the terminals of the DUT 1 to which the H signal is output to the terminals of the DUT 1 to which the L signal is output due to the provision of the diode unit 182. Thus, a total sum of currents flowing from the voltage application circuit 4 to each of the terminals of the DUT 1 to which the L signal is output is precisely measured by the current measure unit 3. Consequently, the output voltage of the voltage application circuit 4 has only to meet the following condition.

The output voltage of the voltage application circuit 4>(the terminal voltage of each of the terminals of the DUT 1 to which the L signal is output+the forward-bias voltage of each of the diodes of the diode unit 182)

Thus, whether the DUT 1 is a non-defective or a defective can be precisely judged without suffering an influence of the fluctuation in the terminal voltages at each of the terminals of the DUT 1 to which the H signal is output.

Embodiment 14

Figure 20:
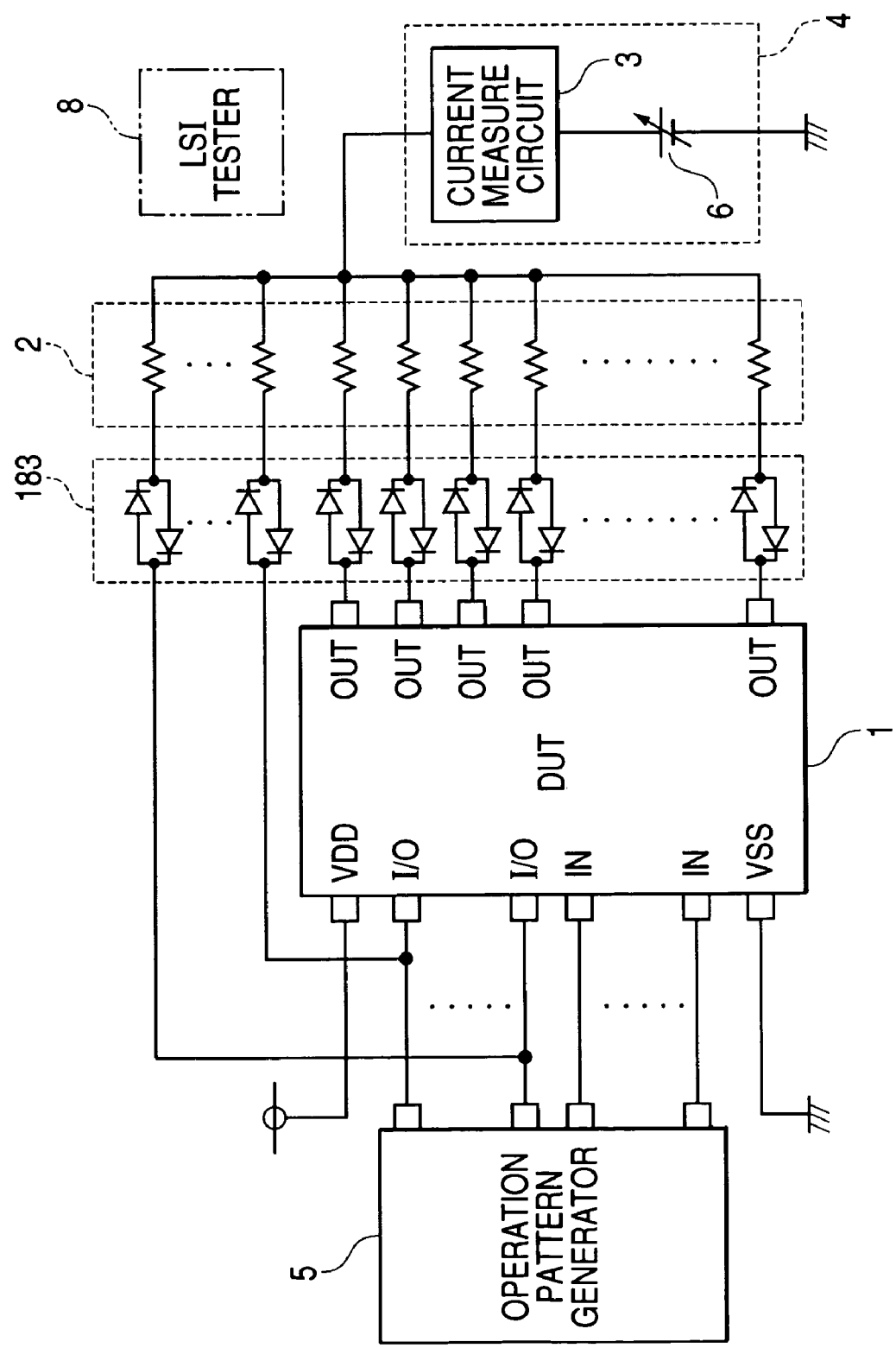
FIG. 20 is a block diagram, partly in circuit diagram, showing a configuration of a semiconductor integrated circuit testing device according to Embodiment 14 of the present invention.

FIG. 20 is a block diagram, partly in circuit diagram, showing a configuration of a semiconductor integrated circuit testing device according to Embodiment 14 of the present invention. A configuration of Embodiment 14 is basically the same as that of Embodiment 12, so in FIG. 20, the same constituent elements as those of Embodiment 12 shown in FIG. 18 are designated with the same reference numerals, and their descriptions are omitted here for the sake of simplicity, and only different constituent elements will hereinafter be described.

In Embodiment 12 described above, the output voltage of the voltage application circuit 4 needs to be set to the terminal voltage when the output terminals (OUT) or the input-output terminals (I/O) of the DUT 1 to which the L signal is output, respectively. In addition, in Embodiment 13, the output voltage of the voltage application circuit 4 needs to be set to the terminal voltage when the output terminals (OUT) or the input-output terminals (I/O) of the DUT 1 to which the H signal is output, respectively. However, Embodiment 14 provides a semiconductor integrated circuit testing device free from such a setting.

That is, in Embodiment 14, the diode unit 181 of Embodiment 12 shown in FIG. 18 is replaced with a diode unit 183. Note that in Embodiment 14 as well, the semiconductor integrated circuit testing device may be provided with the switch control unit 161 and the switch control signal generator 162, or may not be provided with the switch control unit 161 and the switch control signal generator 162. Hereinafter, a description will be given by giving a case where the semiconductor integrated circuit testing device is provided with neither the switch control unit 161 nor the switch control signal generator 162 as an example.

The diode unit 183 is constituted by diodes the number of which is twice as large as that of resistors of the resistor unit 2. In the diode unit 183, the two diodes are connected in parallel to each other in a pair so as to have the senses opposite to each other. One terminals of each of the pairs of diodes is connected to each of resistors of a resistor unit 2, and one of the other terminals of each of the pairs of diodes is connected to one of the output terminals (OUT) and input-output terminals (I/O) of DUT 1.

When such a diode unit 183 is provided, the following condition is set for terminal voltages at the output terminals (OUT) and the input-output terminals (I/O) of the DUT 1.

(The terminal voltage at each of the terminals of the DUT 1 to which the H signal is output–the terminal voltage at each of the terminals of the DUT 1 to which the L signal is output)>(a forward-bias voltage of each of the diodes constituting the diode unit 183×2)

As a result, any one of the two diodes constituting each of the pairs of diodes of the diode unit 183 blocks a flow of an unnecessary current. Thus, the precise current measure is carried out in the current measure circuit 3 irrespective of the output voltage of the voltage application circuit 4, and hence it becomes possible to precisely judge whether the DUT 1 is a non-defective or a defective.

That is, the terminal voltage at each of the terminals of the DUT to which the H signal and the L signal is obtained in start of the measure, to select the terminal voltage, on the stable side having the less fluctuation, of a plurality of resultant terminal voltages, and the output voltage of the voltage application circuit 4 is set so as to be equal to the selected terminal voltage.

In addition, in Embodiment 14, the measure independent of the magnitude of the output voltage of the voltage application circuit 4 can be carried out. Hence, by adjusting the magnitude of the output voltage of the voltage application circuit 4, the magnitudes of the currents caused to flow through the resistors of the resistor unit 2, respectively, can be controlled so as to have a suitable value, thereby making it possible to select the optimal measure condition at all times.

Embodiment 15

Figure 21:
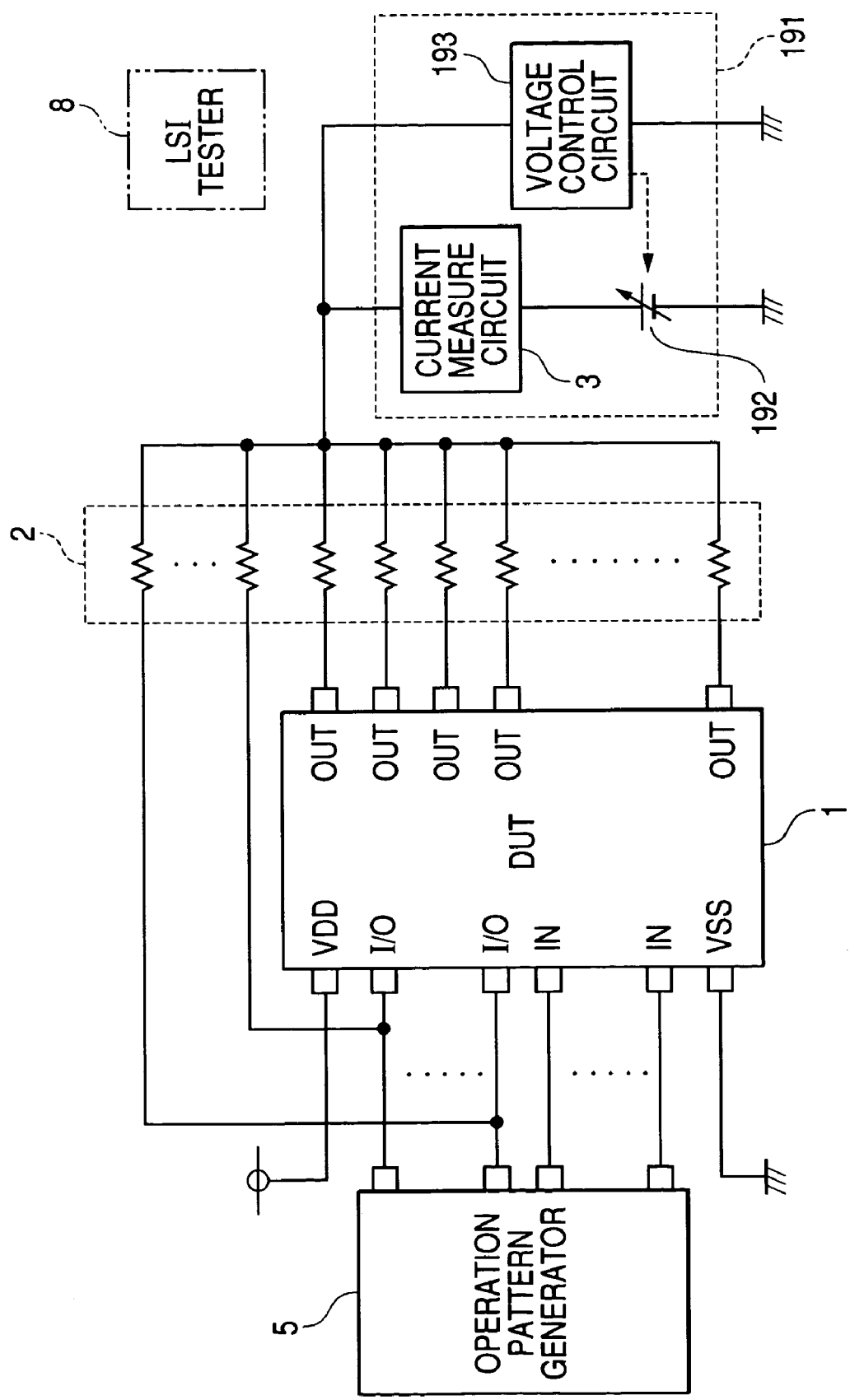
FIG. 21 is a block diagram, partly in circuit diagram, showing a configuration of a semiconductor integrated circuit testing device according to Embodiment 15 of the present invention.

FIG. 21 is a block diagram, partly in circuit diagram, showing a configuration of a semiconductor integrated circuit testing device according to Embodiment 15 of the present invention. A configuration of Embodiment 15 is basically the same as that of Embodiment 12, so in FIG. 20, the same constituent elements as those of Embodiment 12 shown in FIG. 18 are designated with the same reference numerals, and their descriptions are omitted here for the sake of simplicity, and only different constituent elements will hereinafter be described.

In Embodiment 15, the semiconductor integrated circuit testing device is provided with no diode unit 181 in Embodiment 12 shown in FIG. 18, and hence a voltage application circuit 191 is different in configuration from the voltage application circuit 4 in Embodiment 12. Note that in Embodiment 15 as well, the semiconductor integrated circuit testing device may be provided with the switch unit 161 and the switch control signal generator 162, or is provided neither with the switch unit 161 nor the switch control signal generator 162. Hereinafter, a description will be given by giving a case where the semiconductor integrated circuit testing device may not be provided with the switch unit 161 and the switch control signal generator 167 as an example.

A voltage application circuit 191 includes a variable D.C. power supply 192 adapted to make its output voltage variable instead of the D.C. power supply 7 in Embodiment 12, and also further includes a voltage control circuit 193 for controlling the output voltage of the variable D.C. power supply 192 in correspondence to a voltage which the voltage application circuit 191 applies to the resistor unit 2. One terminals of the voltage control unit 193 is connected to a terminal of the current measure circuit 3 on the side of the resistor unit 2, and the other terminal thereof is grounded. Then, the voltage control unit 193 monitors the voltage which the voltage application circuit 191 applies to the resistor unit 2, and when this voltage drops, raises the output voltage of the variable D.C. power supply 192 so as to maintain the voltage which the voltage application circuit 191 applies to the resistor unit 2 at a constant value.

Note that, in this case, it is supposed that the output voltage of the voltage application circuit 191 is set equal to the terminal voltage when the output terminals (OUT) or the input-output terminals (I/O) of the DUT 1 to which the L signal is output (low level signals), respectively.

That is, in the case where the number of terminals of the DUT 1 is large, as the number of terminals of the DUT 1 to which the H signal is output becomes larger, a total sum of currents flowing from each of the terminals of the DUT 1 to which the H signal is output to the current measure circuit 3 increases. Hence, a voltage drop across the current measure circuit 3 due to an internal resistance of the current measure circuit 3 cannot be disregarded. In other words, the voltage which the voltage application circuit 191 applies to the resistor unit 2 changes by this voltage drop, and hence amounts of currents caused to flow through each of the resistors of the resistor unit 2 connected to each of the terminals of the DUT 1 to which the H signal is output, fluctuate from their essential values.

Then, the voltage control circuit 193 always monitors the voltage of the current measure circuit 3 on the side of the resistor unit 2, and controls the variable D.C. power supply 192 so that the monitored voltage is always maintained at a predetermined constant voltage, whereby the voltage which the voltage application circuit 191 applies to the resistor unit 2 is maintained at a predetermined constant voltage. As a result, even when the number of terminals of the DUT 1 to which the H signal is output largely increases or decreases, a constant current can be usually caused to flow through each of the resistors of the resistor unit 2 connected to the terminals of the DUT 1 to which the H signal is output.

Embodiment 16

Figure 22:
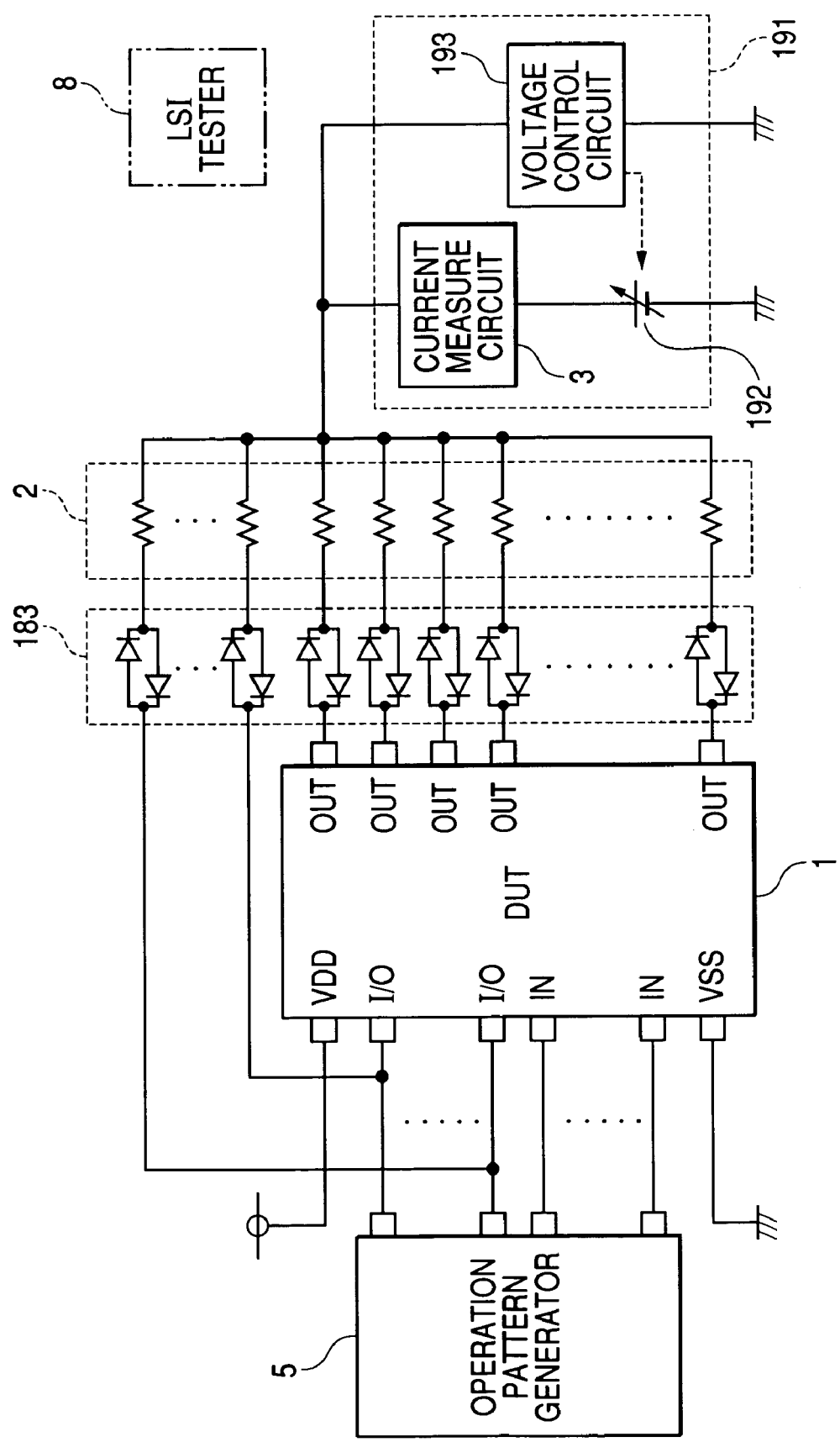
FIG. 22 is a block diagram, partly in circuit diagram, showing a configuration of a semiconductor integrated circuit testing device according to Embodiment 16 of the present invention.

FIG. 22 is a block diagram, partly in circuit diagram, showing a configuration of a semiconductor integrated circuit testing device according to Embodiment 16 of the present invention. A configuration of Embodiment 16 is obtained by combining the configurations of Embodiments 14 and 15 with each other. In FIG. 22, the same constituent elements as those of Embodiment 14 shown in FIG. 20 and the same constituent elements as those of Embodiment 15 shown in FIG. 21 are designated with the same reference numerals, respectively, and their descriptions are omitted here for the sake of simplicity.

The configurations of Embodiments 14 and 15 are combined with each other, whereby the precise current measure is carried out by the current measure circuit 3 irrespective of the output voltage of the voltage application circuit 191, and hence it becomes possible to precisely judge whether the DUT 1 is a non-defective or a defective. Also, the magnitude of the output voltage of the voltage application circuit 191 is adjusted, whereby the magnitudes of the currents caused to flow through the resistors of the resistor unit 2, respectively, can be controlled so as to become suitable values, thereby allowing the optimal measure conditions to be usually selected. In addition, the voltage which the voltage application circuit 191 applies to the resistor unit 2 is held at a constant voltage, and hence even if the number of terminals of the DUT 1 to which the H signal is output largely increases or decreases, a constant current can be usually caused to flow through each of the resistors of the resistor unit 2 connected to the terminals of the DUT 1 to which the H signal is output.

Note that while in Embodiment 16, the configuration of Embodiment 15 is combined with the configuration of Embodiment 14, instead of this combination, the configuration of Embodiment 15 may also be combined with the configuration of Embodiment 12 or 13.

Note that, in Embodiments as described above, it is the bases of the principles that disagreement in output signal between the test target semiconductor integrated circuit (IC) and the non-defective sample (standard IC) or the testing device is detected based on the currents caused to flow through the respective power supply terminals. Then, how to observe and detect a waveform of the current caused to flow through the power supply terminal should be selected in correspondence to the objective IC, and a method including comparing the detected current values with each other also should be selected in correspondence to the objective IC.

In addition, the present invention can also be applied to not only a test for a digital IC, but also a test for an analog IC such as a D/A converter.

According to Embodiments described above, whether the semiconductor integrated circuit is a non-defective or a defective can be simply judged without carrying out the logic simulation and the failure simulation.

In addition, the output terminals of the semiconductor integrated circuit are divided into a plurality of blocks, and the normality/abnormality judgment is repeatedly carried out for each of the blocks, whereby it is possible to specify an output abnormal terminal of the semiconductor integrated circuit.

In addition, a plurality of buffers are connected between the output terminals of the semiconductor integrated circuit and the resistors, respectively, whereby the current value having the magnitude required for a test for the semiconductor integrated circuit can be obtained without suffering an influence of the output ability and the allowable power consumption of the semiconductor integrated circuit.

In addition, the control for the output operation and the stop of the output operation of the buffers is carried out at a timing of the measure, whereby it is possible to block the current flowing through the current measure circuit for a non-measure period of time, and thus the calorification due to the current flow can be suppressed to reduce an error in the measured value in the current measure circuit.

In addition, the control for the output operation and the stop of the output operation of the buffers is carried out independently every buffer, whereby an abnormal output terminal can be specified without increasing the circuit scale of the testing device. Also, the necessary time required for this specifying operation can be shortened.

In addition, since the two criterion zones having the predetermined widths with the maximum current value and the minimum current value as the respective central values, the maximum current value and the minimum current value being obtained from the normal values of the total sums of values of the currents in the non-defective sample for the operation steps of the predetermined operation pattern, are produced to carry out the judgment. Hence, the judgment can be simply carried out to shorten the test time.

In addition, the current measure range of the current measure circuit is set using the maximum current value in the non-defective sample, and the resistance values of a plurality of resistors are set to suitable values, respectively, and thereafter, the current measured value for each operation step of the predetermined operation pattern in the semiconductor integrated circuit is compared with that in the non-defective sample to judge whether the semiconductor integrated circuit is a non-defective or a defective. Hence, whether the semiconductor integrated circuit is a non-defective or a defective can be more precisely judged.

In addition, the pattern signal used to test the functions of the semiconductor integrated circuit is input to the input terminals and the input-output terminals of the semiconductor integrated circuit, and the expected value signal which the semiconductor integrated circuit should output in the normal operation is applied to the input terminals and the input-output terminals of the semiconductor integrated circuit through the load, and the power supply currents of the output stage driver circuit of the testing device adapted to apply the expected value signal and the power supply currents of the semiconductor integrated circuit are monitored to test the functions of the semiconductor integrated circuit. Hence, the comparator for monitoring the output signals of the semiconductor integrated circuit as an object of a test, and memory for storing therein the data of the output pattern becomes unnecessary, and thus the testing device can be simplified and miniaturized.

In addition, the conventional comparators provided in all the output terminals, respectively, for comparing the output values with the expected value become unnecessary, and hence the test for an LSI having a larger number of terminals and the parallel test can be readily realized.

In addition, while conventionally, the program of timing/pattern is separately produced for the driver and the computer, the program can be produced through only the timing/pattern production for the driver, and thus the program becomes simple. Moreover, the cost of the testing device can be reduced.

Also, it is possible to prevent the leakage currents from leaking through the terminals of the semiconductor integrated circuit, and hence the currents which should be essentially measured by the measure means can be precisely measured by the measure means, which results in that whether the semiconductor integrated circuit is a non-defective or a defective can be precisely judged.

Also, the precise measure can be carried out by the measure means without suffering an influence of the fluctuation in the output terminal voltages of the semiconductor integrated circuit, which results in that whether the semiconductor integrated circuit is a non-defective or a defective can be precisely judged.

Also, the amounts of currents caused to flow through a plurality of resistors can be made suitable current values irrespective of the internal resistance of the voltage application means.

Moreover, the measure means can carry out the current measure without reducing the measure precision.

Although the present invention has been described in its preferred form with a certain degree of particularity, many apparently widely different embodiments of the invention can be made without departing from the spirit and the scope thereof. It is to be understood that the invention is not-limited to the specific embodiments thereof except as defined in the appended claims.

This application claims priority from Japanese Patent Applications No. 2003-374912 filed on Nov. 4, 2003 and No. 2004-291813 filed on Oct. 4, 2004, which are hereby incorporated by reference herein.

What is claimed is:

1. A semiconductor integrated circuit testing device, comprising:
  a plurality of resistors connected to a plurality of output terminals of a semiconductor integrated circuit;
  application means for applying a predetermined voltage to the plurality of resistors;
  input means for inputting a predetermined operation pattern signal to a plurality of input terminals of the semiconductor integrated circuit;
  measure means for measuring a total sum of amounts of currents which are caused to flow through the plurality of resistors, respectively, based on the predetermined operation pattern signal input with the input means;
  comparison means for comparing a total sum of amounts of currents which are measured in the semiconductor integrated circuit with the measure means with a normal value of a total sum of amounts of currents which are measured with the measure means in a non-defective sample which is used instead of the semiconductor integrated circuit and is verified in advance to normally operate based on the input predetermined operation pattern signal; and
  judgment means for judging, based on the comparison results obtained with the comparison means, whether or not the semiconductor integrated circuit is normal.

2. A semiconductor integrated circuit testing device according to claim 1, wherein the predetermined resistance values are set independently of one another in the plurality of resistors.

3. A semiconductor integrated circuit testing device according to claim 1, wherein the predetermined operation pattern signal has a plurality of operation steps, and the measure means, and the comparison means carry out the measure and the comparison every operation step of the predetermined operation pattern signal, respectively.

4. A semiconductor integrated circuit testing device according to claim 1, wherein the plurality of output terminals of the semiconductor integrated circuit are divided into a plurality of blocks, and the application means, the input means, the measure means, the comparison means, and the judgment means are individually operated for each of the plurality of blocks.

5. A semiconductor integrated circuit testing device according to claim 4, wherein the block when the semiconductor integrated circuit is judged to be abnormal by the judgment means is divided into a plurality of blocks, and the application means, the input means, the measure means, the comparison means and the judgment means are individually repeatedly operated for each of the divided blocks to narrow a portion having abnormality in the semiconductor integrated circuit.

6. A semiconductor integrated circuit testing device according to claim 1, wherein the plurality of resistors can take a first state in which the predetermined resistance values are equal to one another in the plurality of resistors, and a second state in which the predetermined resistance values are different from one another in the plurality of resistors, and the application means, the input means, the measure means, the comparison means, and the judgment means operate in both the first state and the second state, and when the judgment means judges in both the first state and the second state that the semiconductor integrated circuit is normal, the semiconductor integrated circuit is finally judged to be normal.

7. A semiconductor integrated circuit testing device according to claim 1, wherein the plurality of resistors are connected to the plurality of output terminals of the semiconductor integrated circuit through a plurality of buffers, respectively.

8. A semiconductor integrated circuit testing device according to claim 7, further comprising control signal output means for outputting a control signal having an ON period of time for which the plurality of buffers are caused to output output signals, and an OFF period of time for which the plurality of buffers are stopped from outputting output signals synchronously with the predetermined operation pattern signal.

9. A semiconductor integrated circuit testing device according to claim 8, wherein timings for generation of the ON period of time and timings for generation of the OFF period of time of the control signal are identical over each of the plurality of buffers.

10. A semiconductor integrated circuit testing device according to claim 8, wherein timings for generation of the ON period of time of the control signal are different from each other between the plurality of buffers.

11. A semiconductor integrated circuit testing device according to claim 8, wherein the predetermined operation pattern signal has a plurality of operation steps, and the measure means and the comparison means carry out the measure and the comparison every operation step of the predetermined operation pattern signal, respectively.

12. A semiconductor integrated circuit testing device according to claim 11, wherein the ON period of time of the control signal is set in a period of time for which amounts of currents caused to flow through the plurality of resistors are stable in each of the operation steps of the predetermined operation pattern.

13. A semiconductor integrated circuit testing device according to claim 11, further comprising specifying means for causing the control signal output means to generate the control signal so that in the operation step of the predetermined operation pattern in which the judgment means judges that the semiconductor integrated circuit is abnormal, the ON periods of time of the control signal are allocated to each of the plurality of buffers, respectively, to specify an output abnormal terminal of the semiconductor integrated circuit based on the judgment results obtained from the judgment means.

14. A semiconductor integrated circuit testing device according to claim 3, wherein the comparison means comprises:
a first detection means for detecting an extreme value among normal values of total sums of amounts of currents each obtained every operation step, which are measured by the measure means over all the operation steps of the predetermined operation pattern in a non-defective sample which is used instead of the semiconductor integrated circuit, has the same functions as the functions of the semiconductor integrated circuit, and is verified in advance to normally operate based on the input predetermined operation pattern;
production means for producing a criterion zone having a predetermined width based on the extreme value detected by the first detection means;
a second detection means for detecting an extreme value among total sums of amounts of currents each obtained every operation step, which are measured by the measure means over all the operation steps of the predetermined operation pattern signal in the semiconductor integrated circuit; and
determining means for determining whether or not the extreme value detected by the second detection means falls within the criterion zone produced by the production means.

15. A semiconductor integrated circuit testing device according to claim 14, wherein:
the extreme value detected by the first detection means is a maximum current value among the normal values of the total sums of amounts of currents each obtained every operation step, which are measured by the measure means over all the operation steps of the predetermined operation pattern signal in the non-defective sample; and
the semiconductor integrated circuit testing device further comprises setting means for, when the first determining means determines that the extreme value falls within the criterion zone, setting a current measure range of the measure means and resistance values of the plurality of resistors based on the maximum current value.

16. A semiconductor integrated circuit testing device according to claim 15, wherein the comparison means, after the setting by the setting means, compares the total sum of amounts of currents each obtained every operation step, which are measured by the measure means over all the operation steps of the predetermined operation pattern signal in the semiconductor integrated circuit with a normal value of the total sum of amounts of currents each obtained every operation step, which are measured by the measure means over all the operation steps of the predetermined operation pattern signal in the non-defective sample used instead of the semiconductor integrated circuit every operation step.

17. A semiconductor integrated circuit testing method applied to a semiconductor integrated circuit testing device including a plurality of resistors connected to a plurality of output terminals of a semiconductor integrated circuit, the method comprising:
an application step of applying a predetermined voltage to the plurality of resistors;
an input step of inputting a predetermined operation pattern signal to a plurality of input terminals of the semiconductor integrated circuit;
a measure step of measuring a total sum of amounts of currents which are caused to flow through the plurality of resistors, respectively, based on the predetermined operation pattern signal input through the input step;
a comparison step of comparing a total sum of amounts of currents which are measured in the semiconductor integrated circuit through the measure step with a normal value of a total sum of amounts of currents which are measured through the measure step in a non-defective sample which is used instead of the semiconductor integrated circuit and is verified in advance to normally operate based on the input predetermined operation pattern signal; and
a judgment step of judging, based on the comparison results obtained through the comparison step, whether or not the semiconductor integrated circuit is normal.

* * * * *